US008947138B2

(12) United States Patent
Oshiyama et al.

(10) Patent No.: US 8,947,138 B2
(45) Date of Patent: Feb. 3, 2015

(54) PHASE ADJUSTMENT CIRCUIT AND INTERFACE CIRCUIT

(71) Applicant: Fujitsu Limited, Kawasaki-shi, Kanagawa (JP)

(72) Inventors: Hiroki Oshiyama, Yokohama (JP); Takayuki Hamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/190,295

(22) Filed: Feb. 26, 2014

(65) Prior Publication Data

US 2014/0174387 A1    Jun. 26, 2014

Related U.S. Application Data

(63) Continuation of application No. PCT/JP2011/069999, filed on Sep. 2, 2011.

(51) Int. Cl.
   *H03L 7/06* (2006.01)
   *F01L 1/344* (2006.01)
   *H03K 5/13* (2014.01)

(52) U.S. Cl.
   CPC .............. *F01L 1/344* (2013.01); *H03K 5/131* (2013.01); *H03K 5/133* (2013.01)
   USPC .......................................... 327/156; 327/147

(58) Field of Classification Search
   USPC ................................. 327/147, 156
   See application file for complete search history.

(56) References Cited

U.S. PATENT DOCUMENTS 6,175,258 B1 *   1/2001   Yim ............................... 327/158
6,285,723 B1 *   9/2001   Yamada et al. ............... 375/354
6,349,070 B1 *   2/2002   Yim ........................... 365/233.11
6,448,953 B1 *   9/2002   Murade ............................ 345/98
6,762,754 B2 *   7/2004   Murade ........................... 345/204
7,400,168 B2 *   7/2008   Katou ............................. 326/68
8,400,196 B2 *   3/2013   Kim ............................... 327/156

(Continued)

FOREIGN PATENT DOCUMENTS

JP     2001-44822      2/2001
JP     2001-196904     7/2001

(Continued)

OTHER PUBLICATIONS

Chang, Hsiang-Hui et al., "A 0.7-2-GHz Self-Calibrated Multiphase Delay-Locked Loop", IEEE Journal of Solid-State Circuits, vol. 41, No. 5, May 2006, pp. 1051-1061.
International Search Report, mailed in connection with PCT/JP2011/069999, and mailed Oct. 11, 2011.

*Primary Examiner* — Adam Houston
(74) *Attorney, Agent, or Firm* — Fujitsu Patent Center

(57) ABSTRACT

In a phase adjustment circuit, a first phase adjuster has a plurality of parallel-connected first inverters that receives an input signal to be phase-adjusted, wherein a first inverter to be activated is selected by a first control signal. A second phase adjuster has a plurality of parallel-connected second inverters that receives the input signal with a predetermined delay time, wherein a second inverter to be activated is selected by a second control signal. An output circuit receives output signals of the first and second phase adjusters and outputs a signal whose phase is adjusted within a range of the delay time. The second phase adjuster further includes transistors connected to the second inverters. During the delay time, these transistors block a current path between the first and second phase adjusters, under the control of the input signal.

6 Claims, 24 Drawing Sheets

(56) References Cited

U.S. PATENT DOCUMENTS

| | | |
|---|---|---|
| 2002/0140484 A1 | 10/2002 | Komura et al. |
| 2003/0001831 A1* | 1/2003 | Murade .................. 345/204 |
| 2003/0201964 A1* | 10/2003 | Murade .................. 345/100 |
| 2006/0220696 A1* | 10/2006 | Katou ...................... 327/100 |
| 2014/0174387 A1* | 6/2014 | Oshiyama et al. ......... 123/90.17 |
| 2014/0203756 A1* | 7/2014 | Kajiura et al. ................ 318/812 |

FOREIGN PATENT DOCUMENTS

| | | |
|---|---|---|
| JP | 2002-290217 | 10/2002 |
| JP | 2004-129110 | 4/2004 |

* cited by examiner

| CONTROL CODE | | INSTRUCTION SIGNAL | | | | |
|---|---|---|---|---|---|---|
| CODE[4] | CODE[3] | SEL[0] | SEL[1] | SEL[2] | SEL[3] | SEL[4] |
| 0 | 0 | 1 | 1 | 0 | 0 | 0 |
| 0 | 1 | 0 | 1 | 1 | 0 | 0 |
| 1 | 0 | 0 | 0 | 1 | 1 | 0 |
| 1 | 1 | 0 | 0 | 0 | 1 | 1 |

FIG. 7

| CONTROL CODE | | | INSTRUCTION SIGNAL | | | | | | | |
|---|---|---|---|---|---|---|---|---|---|---|
| CODE[2] | CODE[1] | CODE[0] | EN[7] | EN[6] | EN[5] | EN[4] | EN[3] | EN[2] | EN[1] | EN[0] |
| 0 | 0 | 0 | 1 | 1 | 1 | 1 | 1 | 1 | 1 | 1 |
| 0 | 0 | 1 | 1 | 1 | 1 | 1 | 1 | 1 | 1 | 0 |
| 0 | 1 | 0 | 1 | 1 | 1 | 1 | 1 | 1 | 0 | 0 |
| 0 | 1 | 1 | 1 | 1 | 1 | 1 | 0 | 0 | 0 | 0 |
| 1 | 0 | 0 | 1 | 1 | 1 | 0 | 0 | 0 | 0 | 0 |
| 1 | 0 | 1 | 1 | 1 | 0 | 0 | 0 | 0 | 0 | 0 |
| 1 | 1 | 1 | 1 | 0 | 0 | 0 | 0 | 0 | 0 | 0 |

FIG. 8

| INSTRUCTION SIGNAL | | CONTROL SIGNAL | |
|---|---|---|---|
| SEL | EN | ENP | ENN |
| 0 | 0 | 1 | 0 |
| 0 | 1 | 1 | 0 |
| 1 | 0 | 1 | 0 |
| 1 | 1 | 0 | 1 |

| CONTROL CODE | | CONTROL SIGNAL | | | | | INSTRUCTION SIGNAL | | | | |
|---|---|---|---|---|---|---|---|---|---|---|---|
| CODE[4] | CODE[3] | WS[0] | WS[1] | WS[2] | WS[3] | WS[4] | SEL[0] | SEL[1] | SEL[2] | SEL[3] | SEL[4] |
| 0 | 0 | 0 | 1 | 0 | 0 | 0 | 1 | 1 | 0 | 0 | 0 |
| 0 | 1 | 0 | 0 | 1 | 0 | 0 | 0 | 1 | 1 | 0 | 0 |
| 1 | 0 | 0 | 0 | 0 | 1 | 0 | 0 | 0 | 1 | 1 | 0 |
| 1 | 1 | 0 | 0 | 0 | 0 | 1 | 0 | 0 | 0 | 1 | 1 |

| CONTROL CODE | | CONTROL SIGNAL | | | | |
|---|---|---|---|---|---|---|
| CODE[4] | CODE[3] | WS[0] | WS[1] | WS[2] | WS[3] | WS[4] |
| 0 | 0 | 1 | 1 | 0 | 0 | 0 |
| 0 | 1 | 0 | 1 | 1 | 0 | 0 |
| 1 | 0 | 0 | 0 | 1 | 1 | 0 |
| 1 | 1 | 0 | 0 | 0 | 1 | 1 |

PHASE ADJUSTMENT CIRCUIT AND INTERFACE CIRCUIT

CROSS-REFERENCE TO RELATED APPLICATION

This application is a continuation application of International Application PCT/JP2011/069999 filed on Sep. 2, 2011 which designated the U.S., the entire contents of which are incorporated herein by reference.

FIELD

The embodiments discussed herein relate to a phase adjustment circuit and an interface circuit.

BACKGROUND

In an interface circuit that transmits and receives data between circuit boards, between LSIs (Large Scale Integrated Circuits), between a CPU (Central Processing Unit) and a memory, and so on, a phase adjustment circuit that adjusts the phase of a signal, such as a clock signal, is used.

Conventionally, there is known a technique for suppressing the flow of a shoot-through current during phase adjustment and achieving a reduction of power consumption.

Moreover, in recent years, along with an increase of a clock frequency and the like, there is a need for more accurate phase adjustment. As the phase adjustment circuit for performing a fine phase adjustment, there is known a phase adjustment circuit having a plurality of stages of CMOS (Complementary Metal Oxide Semiconductor) inverters, which adjusts the phase of a clock signal by adjusting the number of inverters to be activated.

Japanese Laid-open Patent Publication No. 2004-129110
Japanese Laid-open Patent Publication No. 2001-44822
"IEEE Journal of Solid-State Circuits", Vol. 41, No. 5, May 2006, pp. 1051-1061

The phase adjustment circuit for performing the fine phase adjustment as described above has problems in that if a shoot-through current flows during phase adjustment, not only the power consumption increases but also the accuracy of phase adjustment degrades. Therefore, with the related art, it is difficult to perform a high-precision phase adjustment with low power consumption.

SUMMARY

According to an aspect of the embodiments disclosed herein, there is provided a phase adjustment circuit including: a first phase adjuster including a plurality of parallel-connected first inverters configured to receive an input signal to be phase-adjusted, the first inverters being activated or deactivated depending on first control signals; a delay circuit configured to delay the input signal to be phase-adjusted by a predetermined delay time; a second phase adjuster including a plurality of parallel-connected second inverters configured to receive the delayed input signal from the delay circuit, the second inverters being activated or deactivated depending on second control signals; and an output circuit configured to receive output signals of the first and second phase adjusters and output a signal whose phase is adjusted within a range of the delay time, wherein the second phase adjuster further includes a plurality of transistors that are connected to the second inverters and controlled by the input signal so as to block a current path between the first phase adjuster and the second phase adjuster during the delay time.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 illustrates an example of a truth table of a weighting control unit;

FIG. 8 illustrates an example of the truth table of a control code conversion unit;

FIG. 10 illustrates an example of the truth table of the weighting selection unit;

FIG. 11 is a truth table illustrating an example of control code values that are input to the phase adjustment control unit and control signals that are output therefrom;

FIG. 16 illustrates an example of the truth table of a weighting control unit;

FIG. 20 illustrates an example of the truth table of a weighting control unit;

FIG. 21 is a truth table illustrating an example of the relationship between control code values and instruction signals on signal lines EN0 to EN7 and ENX0 to ENX7;

DESCRIPTION OF EMBODIMENTS

Hereinafter, embodiments will be described with reference to the accompanying drawings.

Note that, in the description below, a clock signal is used as a signal to be phase-adjusted, but not limited thereto, and a digital signal, such as an aperiodic signal, may be used as the signal to be phase-adjusted.

First Embodiment

Figure 1:
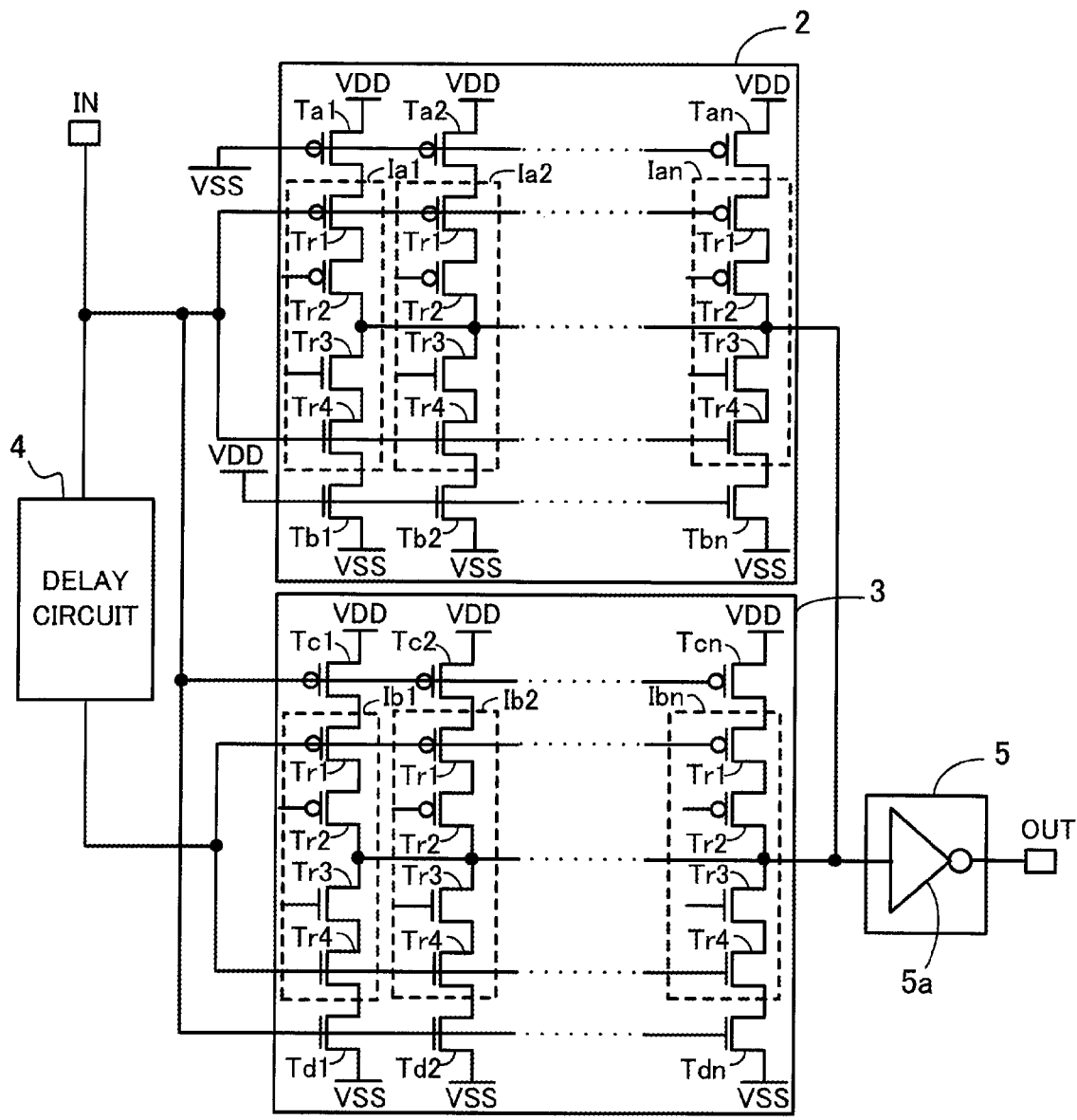
FIG. 1 illustrates an example of a phase adjustment circuit of a first embodiment.

FIG. 1 illustrates an example of a phase adjustment circuit of a first embodiment.

A phase adjustment circuit 1 includes phase adjusters 2 and 3, a delay circuit 4, and an output circuit 5.

The phase adjuster 2 includes a plurality of stages of parallel-connected inverters Ia1, Ia2, . . . , and Ian. The inverter Ia1 has p-channel MOSFETs (Metal-Oxide-Semiconductor Field-Effect Transistors) (hereinafter, abbreviated as pMOSs) Tr1 and Tr2 and n-channel MOSFETs (hereinafter, abbreviated as nMOSs) Tr3 and Tr4.

In the inverter Ia1, the drain of pMOS Tr1 is connected to the source of pMOS Tr2, the drain of pMOS Tr2 is connected to the drain of nMOS Tr3, and the source of nMOS Tr3 is connected to the drain of nMOS Tr4. The gates of pMOS Tr1 and nMOS Tr4 are connected to an input terminal IN, and a clock signal to be phase-adjusted is input to these gates. To the gates of pMOS Tr2 and nMOS Tr3, control signals, though not illustrated, from a phase adjustment control circuit described later are input so as to select whether to activate or deactivate the inverter Ia1. That is, whether or not to perform weighting by the inverter Ia1 is selected during phase adjustment.

The other inverters Ia2 to Ian are attached with the same reference numeral because they have similar transistors.

The nodes between pMOS Tr2 and nMOS Tr3 of the respective inverters Ia1 to Ian are wired-OR connected.

Moreover, the phase adjuster 2 includes pMOSs Ta1, Ta2, . . . , and Tan each connected between pMOS Tr1 of each of the inverters Ia1 to Ian and a power supply line VDD and nMOSs Tb1, Tb2, . . . , and Tbn each connected between nMOS Tr4 and a ground line VSS.

A power supply voltage is applied to the power supply line VDD, and the ground line VSS is set to a reference potential (e.g., 0 V).

The gates of pMOSs Ta1 to Tan are connected to the ground line VSS and the gates of nMOSs Tb1 to Tbn are connected to the power supply line VDD, and all of pMOSs Ta1 to Tan and nMOSs Tb1 to Tbn are turned on.

On the other hand, the phase adjuster 3 also includes a plurality of stages of parallel-connected inverters Ib1, Ib2, . . . , and Ibn. The inverters Ib1 to Ibn have pMOSs Tr1 and Tr2 as well as nMOSs Tr3 and Tr4 as with the above-described inverters Ia1 to Ian. Then, the nodes between pMOS Tr2 and nMOS Tr3 of the respective inverters Ib1 to Ibn are wired-OR connected.

However, in the inverters Ib1 to Ibn, the gates of pMOS Tr1 and nMOS Tr4 are connected to an output terminal of the delay circuit 4 and receive a clock signal delayed by the delay circuit 4.

Moreover, the phase adjuster 3 includes pMOSs Tc1, Tc2, . . . , and Tcn connected between pMOS Tr1 of each of the inverters Ib1 to Ibn and the power supply line VDD and nMOSs Td1, Td2, . . . , and Tdn connected between nMOS Tr4 and the ground line VSS.

The gates of pMOSs Tc1 to Tcn and the gates of nMOSs Td1 to Tdn are connected to the input terminal IN. pMOSs Tc1 to Tcn or nMOSs Td1 to Tdn are controlled by the clock signal before being delayed, and block a current path between the phase adjuster 3 and the phase adjuster 2 during a delay time in the delay circuit 4. That is, pMOSs Tc1 to Tcn and nMOSs Tb1 to Tbn each function as a transistor for blocking a shoot-through current.

The nodes between pMOS Tr2 and nMOS Tr3 of the inverters Ia1 to Ian and Ib1 to Ibn in the phase adjusters 2 and 3 are connected to an input terminal of the output circuit 5.

The delay circuit 4 delays the clock signal, which is input from the input terminal IN, by a predetermined delay time. With the amount of delay here, a phase adjustment range for use by the phase adjusters 2 and 3 is set. The delay circuit 4 is realized by an even number of inverters connected in series or by a plurality of buffer circuits, for example.

The output circuit 5 includes an inverter 5a, and outputs a clock signal whose phase is adjusted within the phase adjustment range set by the delay time in the delay circuit 4, with a voltage of the output node of two wired-or connected phase adjusters 2 and 3 as an input.

In the present embodiment, in the phase adjuster 2, pMOSs Ta1 to Tan and nMOSs Tb1 to Tbn are provided so as to match the physical characteristics of the phase adjuster 2 with the physical characteristics of the phase adjuster 3.

Hereinafter, the operation of the phase adjustment circuit 1 is described.

First, with control signals from a phase adjustment control unit described later, pMOS Tr2 and nMOS Tr3 in some of the respective inverters Ia1 to Ian and inverters Ib1 to Ibn are turned on, which activates the corresponding inverters. At this time, the total number of inverters to operate in the phase adjusters 2 and 3 is set to n, and the number of inverters to be activated in each of the phase adjusters 2 and 3 is adjusted, and thereby phase adjustment is performed in which the phase adjustment range set by the delay circuit 4 is divided by n.

Figure 2:
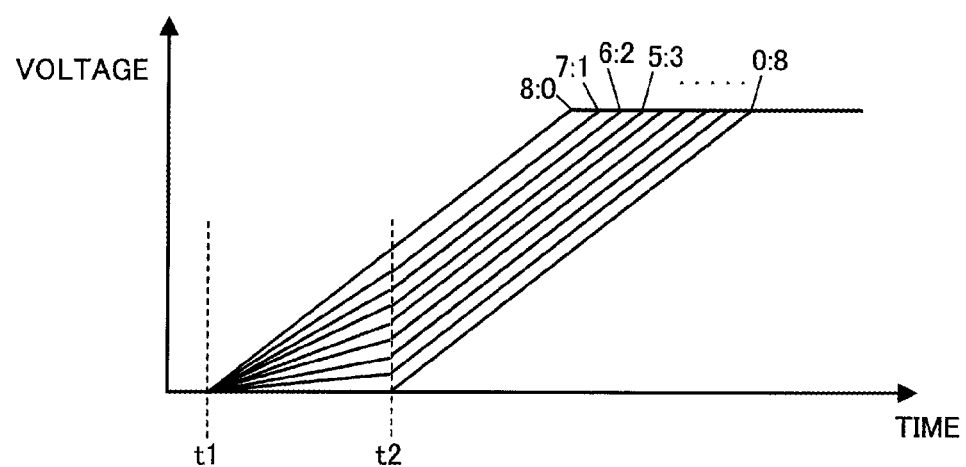
FIG. 2 illustrates an example of a relationship between the number of inverters to operate and a phase adjustment result of a clock signal.

FIG. 2 illustrates an example of a relationship between the number of inverters to operate and phase adjustment results of the clock signal, where the vertical axis represents voltage and the horizontal axis represents time.

FIG. 2 illustrates how the phase at the rising edge of the clock signal that is output from the output circuit 5 behaves. FIG. 2 also illustrates a case where the number of inverters Ia1 to Ian and the number of inverters Ib1 to Ibn in the phase adjusters 2 and 3 are eight, i.e., n=8, respectively. The labels in the form of n1:n2, as in "8:0", "7:1", and the like in FIG. 2, represent the ratio of the number (n1) of active inverters in the phase adjuster 2 to the number (n2) of active inverters in the phase adjuster 3.

At a timing t1, a clock signal that is input from the input terminal IN rises at a speed corresponding to the number of active inverters, i.e., the number of inverters to operate, in the phase adjuster 2. The more the number of inverters to operate, the more the current drive capability increases and therefore the clock signal rises more rapidly. In the example of FIG. 2, when all the inverters Ia1 to Ia8 of the phase adjuster 2 operate, while none of the inverters Ib1 to Ib8 of the phase adjuster 3 operates, i.e., when the ratio of active inverters is 8:0, the clock signal rises most rapidly. When the ratio of active inverters is 0:8, the clock signal begins to rise at time t2 after a delay time caused by the delay circuit 4. This is the slowest rising.

The ratio is adjusted to 8:0, 7:1, 6:2, 5:3, . . . , 0:8 so that the total number of inverters to operate in the phase adjusters 2 and 3 is always eight. In this way, the phase adjustment range determined by the delay time of the delay circuit 4 is divided into eight equal intervals, so that a fine phase adjustment can be achieved by specifying one of these eight choices.

However, between the timings t1 to t2 when the clock signal rises, in the phase adjuster 3 receiving a delayed clock signal, any of the inverters Ib1 to Ib8 in the active state may operate.

Here, as a comparative example, a phase adjustment circuit without pMOSs Tc1 to Tcn and nMOSs Td1 to Tdn illustrated in FIG. 1 is described.

Figure 3:
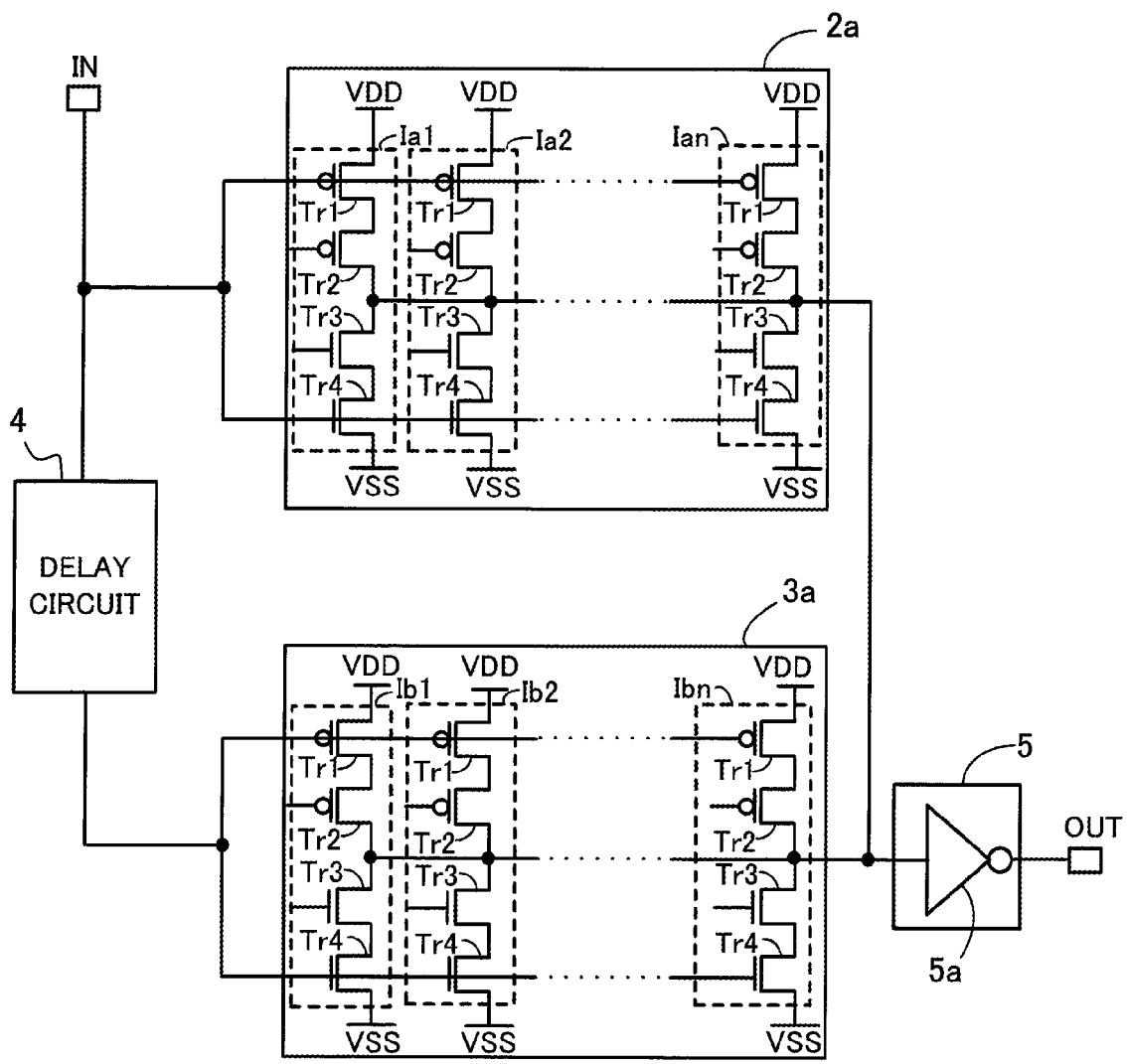
FIG. 3 illustrates a phase adjustment circuit of a comparative example.

FIG. 3 illustrates a phase adjustment circuit of the comparative example.

A component similar to the component of the phase adjustment circuit 1 of FIG. 1 is attached with the same reference numeral. In a phase adjustment circuit 1a illustrated in FIG. 3, phase adjusters 2a and 3a do not include pMOSs Ta1 to Tan, nMOSs Tb1 to Tbn, pMOSs Tc1 to Tcn, and nMOSs Td1 to Tdn unlike the phase adjusters 2 and 3 of FIG. 1.

Figure 4:
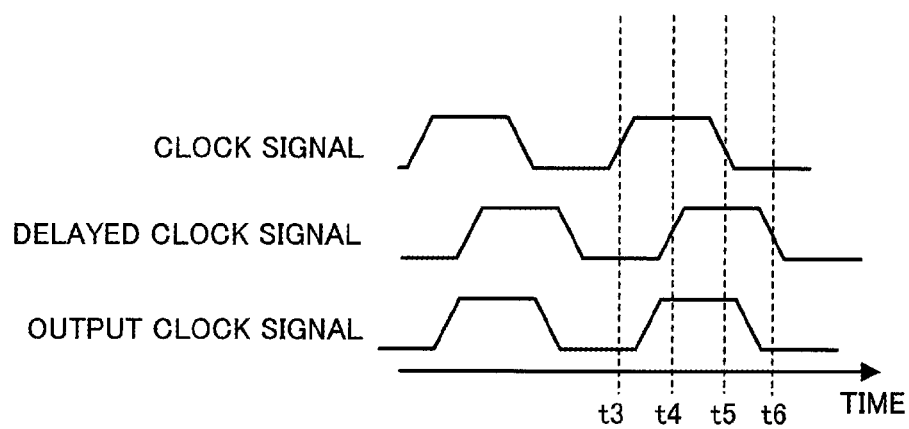
FIG. 4 illustrates an example of a clock signal that is input to two phase adjusters and the output clock signal that is output from an output circuit.

FIG. 4 illustrates an example of a clock signal that is input to the two phase adjusters and an output clock signal that is output from the output circuit.

From the upper side in FIG. 4, there are illustrated a clock signal that is input to the phase adjuster 2a, a clock signal that is delayed by the delay circuit 4 and input to the phase adjuster 3a, and a phase-adjusted output clock signal that is output from the output circuit 5.

At a timing t3, because the clock signal becomes at an H (High) level, nMOSs Tr4 of the inverters Ia1 to Ian in the phase adjuster 2a of FIG. 3 are turned on. Therefore, a current will flow into the ground line VSS via nMOS Tr4 of an inverter, which is activated by a control signal, among the inverters Ia1 to Ian.

On the other hand, the delayed clock signal that is input to the phase adjuster 3a is at an L (Low) level between the timing t3 and the timing t4. Therefore, pMOSs Tr1 of the inverters Ib1 to Ibn in the phase adjuster 3a of FIG. 3 are turned on. Therefore, a shoot-through current will flow from the power supply line VDD of inverter(s) activated by the control signals among the inverters Ib1 to Ibn into the ground line VSS of the phase adjuster 2a via the above-noted pMOSs Tr1.

In this case, the ratio illustrated in FIG. 2 becomes off balance, and the linearity of phase adjustment degrades. For example, although the phase adjustment is supposed to be performed with a ratio of 5:3, even three inverters deactivated in the phase adjuster 3a will operate at the stage of the timings t3 to t4. This, for example, results in a phase similar to the phase obtained when the phase adjustment is performed with the ratio of 2:6.

In contrast, in the phase adjustment circuit 1 of the present embodiment, as illustrated in FIG. 1, pMOSs Tc1 to Tcn and nMOSs Td1 to Tdn controlled by the clock signal before being delayed are connected to the respective inverters Ib1 to Ibn.

In this case, during the timings t3 to t4 of FIG. 4, i.e., during the delay time in the delay circuit 4, because the clock signal of an H level is input to the gates of pMOSs Tc1 to Tcn of the phase adjuster 3, pMOSs Tc1 to Tcn are turned off. Thus, a current path between the phase adjusters 2 and 3 is blocked.

Therefore, with the control signal, whichever of the inverters Ib1 to Ibn becomes active, the operation of these inverters may be stopped during the timing t3 to t4.

Thus, degradation of the phase adjustment accuracy due to flowing of a shoot-through current may be suppressed and the phase adjustment may be performed with a high degree of accuracy. Moreover, the power consumption may be reduced because flow of the shoot-through current may be suppressed.

In the above example, there is illustrated an example of phase adjustment performed at the rising edge of the clock signal, but also at a falling edge, a similar effect may be obtained. During timings t5 to t6 of FIG. 4, because the clock signal of an L level is input to the gates of nMOSs Td1 to Tdn of the phase adjuster 3, nMOSs Td1 to Tdn are turned off and the current path between the phase adjusters 2 and 3 is blocked.

Therefore, with the control signal, whichever of the inverters Ib1 to Ibn becomes active, the operation thereof may be stopped during the timings t5 to t6, the period of which is the delay time in the delay circuit 4.

Thus, degradation of the phase adjustment accuracy due to a shoot-through current flowing may be suppressed and the phase adjustment may be performed with a high degree of accuracy. Moreover, the power consumption may be reduced because flow of the shoot-through current may be suppressed.

Note that, in the above example, pMOSs Ta1 to Tan are connected between the inverters Ia1 to Ian and the power supply line VDD, and nMOSs Tb1 to Tbn are connected between the inverters Ia1 to Ian and the ground line VSS. Moreover, pMOSs Tc1 to Tcn are connected between the inverters Ib1 to Ibn and the power supply line VDD, and nMOSs Td1 to Tdn are connected between the inverters Ib1 to Ibn and the ground line VSS, but not limited thereto.

For example, the connection positions between pMOSs Ta1 to Tan as well as Tc1 to Tcn and pMOS Tr1 or pMOS Tr2 may be switched, and the connection positions between nMOSs Tb1 to Tbn as well as Td1 to Tdn and nMOS Tr3 or nMOS Tr4 may be switched.

Second Embodiment

Figure 5:
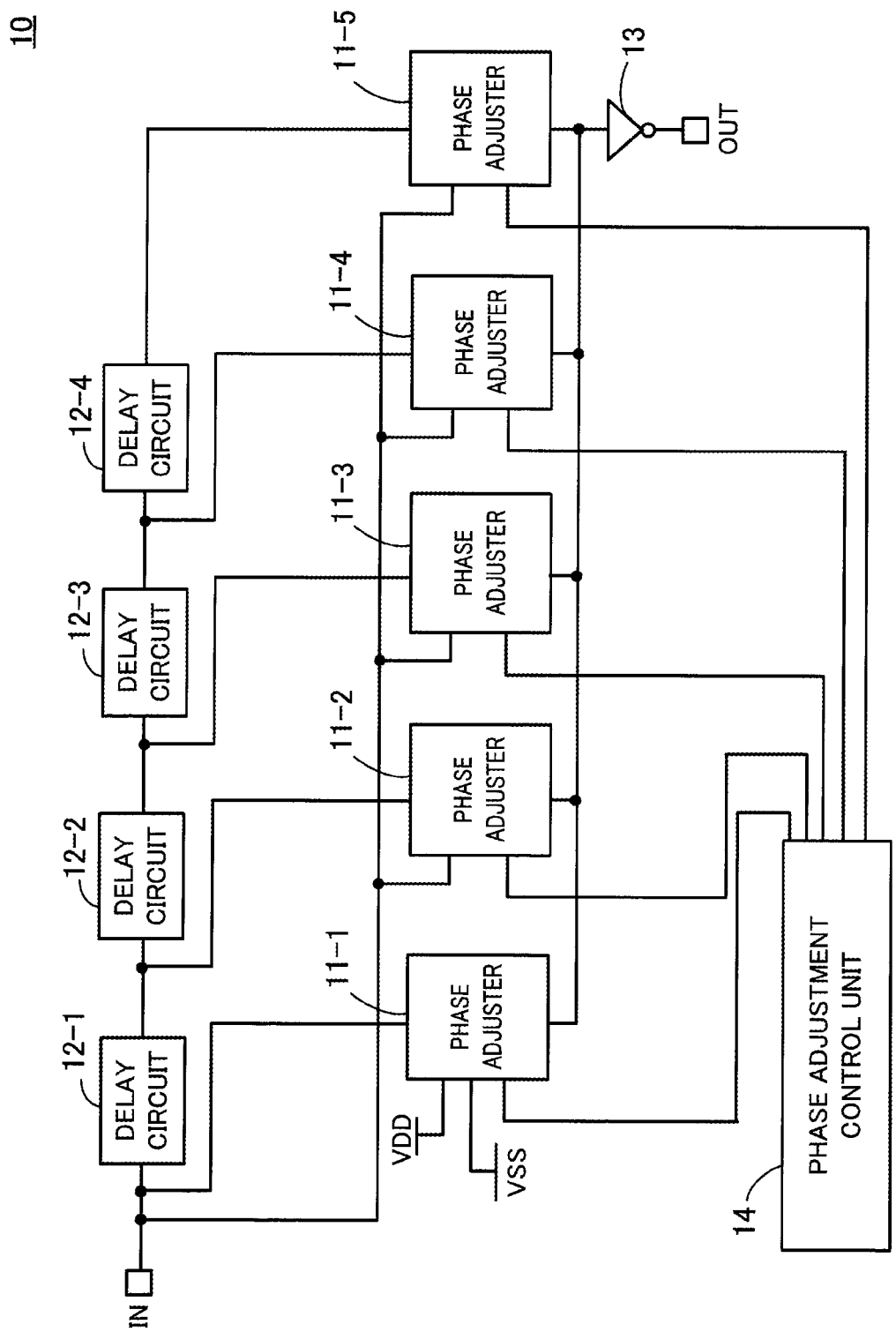
FIG. 5 illustrates an example of a phase adjustment circuit of a second embodiment.

FIG. 5 illustrates an example of the phase adjustment circuit of a second embodiment.

A phase adjustment circuit 10 includes phase adjusters 11-1, 11-2, 11-3, 11-4, and 11-5, delay circuits 12-1, 12-2, 12-3, and 12-4, an inverter 13 that is an output circuit, and a phase adjustment control unit 14.

Among the phase adjusters 11-1 to 11-5, the phase adjuster 11-1 has a circuit similar to the circuit of the phase adjuster 2 illustrated in FIG. 1. While the phase adjusters 11-2 to 11-5 have a circuit similar to the circuit of the phase adjuster 3 illustrated in FIG. 1, which phase adjuster functions as the phase adjuster 2 or 3 illustrated in FIG. 1 is selected in accordance with a phase to be adjusted. The detail will be described later.

The output terminals of the phase adjusters 11-1 to 11-5 are connected to each other, and are further connected to an input terminal of the inverter 13.

The delay circuits 12-1 to 12-4 are connected in series, and delay the clock signal that is input from the input terminal IN. Note that, in the delay circuits 12-1 to 12-4, for example, the same delay time is set, and their phase adjustment ranges are matched with each other. Moreover, during phase adjustment by two adjacent phase adjusters, the amount of delay of each of the delay circuits 12-1 to 12-4 is adjusted so that the level of a delayed clock signal that is input to the phase adjuster in the subsequent stage becomes opposite to a signal level of the clock signal from the input terminal IN.

The phase adjuster 11-2 is connected to a node between the delay circuits 12-1 and 12-2, the phase adjuster 11-3 is connected to a node between the delay circuits 12-2 and 12-3, and the phase adjuster 11-4 is connected to a node between the delay circuits 12-3 and 12-4. Moreover, the output terminal of the delay circuit 12-4 is connected to the phase adjuster 11-5. Thus, in each of the phase adjusters 11-2 to 11-5, a clock signal delayed by a different amount of delay is input.

That is, a clock signal that is delayed in accordance with the number of delay circuits connected between each of the phase adjusters 11-2 to 11-5 and the input terminal IN is input to the phase adjusters 11-2 to 11-5.

The inverter 13 is connected to the output terminal OUT, and outputs a clock signal whose phase is adjusted, in accordance with a potential of the output node of the wired-or connected phase adjusters 11-1 to 11-5.

The phase adjustment control unit 14 outputs, for example, based on control signals (hereinafter, referred to as a control code) from the outside of the phase adjustment circuit 10, control signals for determining which inverters in each of the phase adjusters 11-1 to 11-5 are to be activated. These control signals are input to the gates of pMOS Tr2 and nMOS Tr3 illustrated in FIG. 1.

Figure 6:
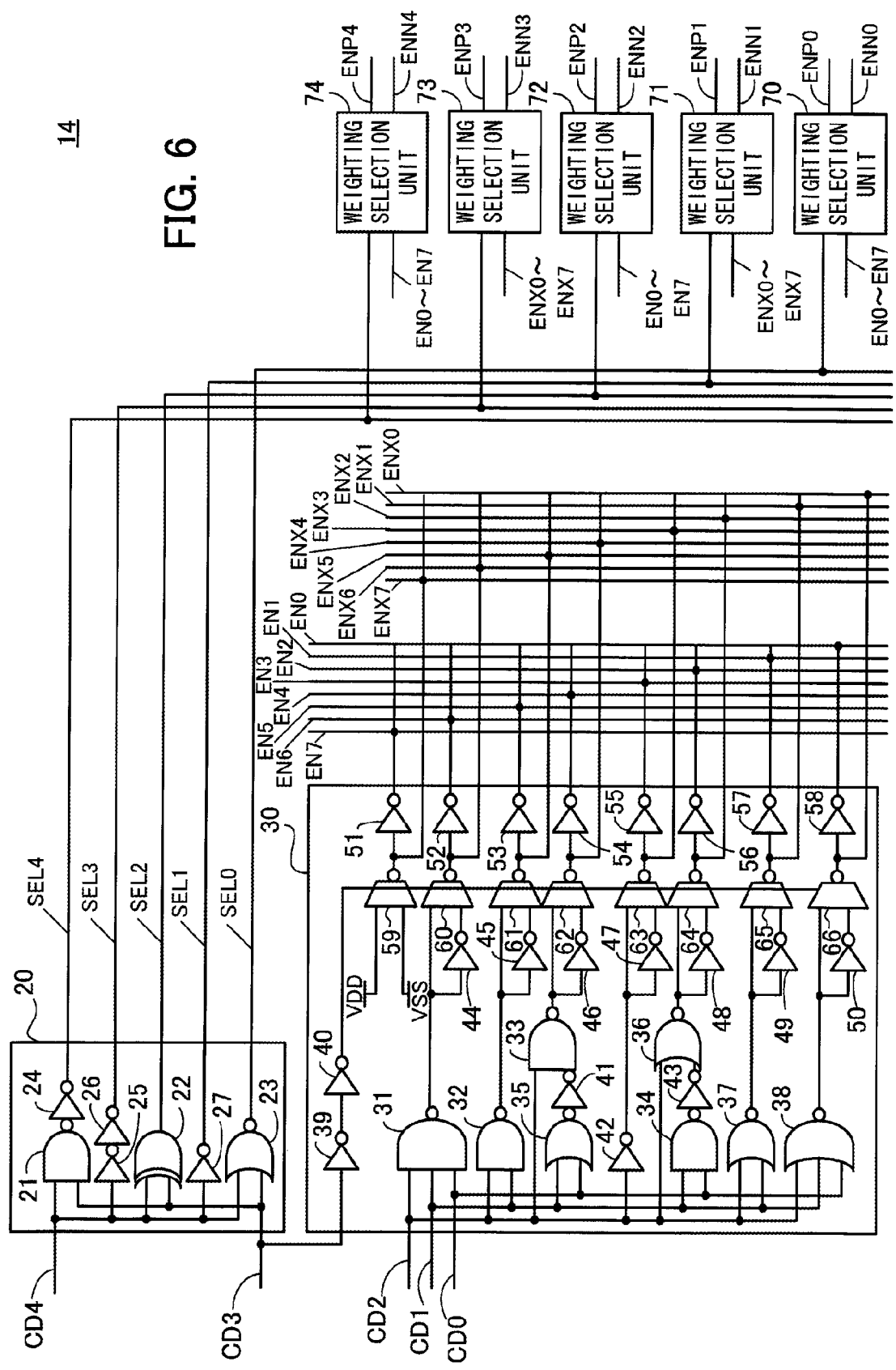
FIG. 6 illustrates an example of a phase adjustment control unit.

FIG. 6 illustrates an example of the phase adjustment control unit.

FIG. 6 illustrates an example of the phase adjustment control unit 14 in the case where five phase adjusters 11-1 to 11-5 illustrated in FIG. 5 each have eight inverters.

The phase adjustment control unit 14 includes a weighting control unit 20, a control code conversion unit 30, and weighting selection units 70, 71, 72, 73, and 74.

The weighting control unit 20 generates, using control codes from the outside that are input via signal lines CD3 and CD4, instruction signals for instructing the weighting selection units 70 to 74 which two of five phase adjusters 11-1 to 11-5 to select. The weighting control unit 20 supplies the generated instruction signals to the weighting selection units 70 to 74 via signal lines SEL0, SEL1, SEL2, SEL3, and SEL4.

FIG. 7 illustrates an example of a truth table of the weighting control unit.

FIG. 7 illustrates a control code CODE[3] that is input via the signal line CD3 and a control code CODE[4] that is input via the signal line CD4. FIG. 7 also illustrates instruction signals SEL[0], SEL[1], SEL[2], SEL[3], and SEL[4] that are transmitted through the signal lines SEL0 to SEL4. The instruction signals SEL[0] to SEL[4] are signals for instructing the weighting selection units 70 to 74 which two of five phase adjusters 11-1 to 11-5 of FIG. 5 to select.

For example, when both the control codes CODE[3] and CODE[4] are "0", both the instruction signals SEL[0] and SEL[1] are "1". In this case, the phase adjusters 11-1 and 11-2 are selected, and phase adjustment using these two phase adjusters 11-1 and 11-2 is performed. Moreover, when the control codes CODE[3] and CODE[4] are "1" and "0", both the instruction signals SEL[1] and SEL[2] are "1". In this case, the phase adjusters 11-2 and 11-3 are selected, and phase adjustment using these two phase adjusters 11-2 and 11-3 is performed.

When each of m phase adjusters has n inverters, n×(m−1) types of phase division may be performed, and therefore when the five phase adjusters 11-1 to 11-5 each have eight inverters, phase adjustment may be performed with 8×4=32 divisions.

For example, when one desires to align a phase with the 30th phase of 32-divided phases, phase adjustment by the phase adjusters 11-4 and 11-5 is performed. In this case, as both the control codes CODE[3] and CODE[4], "1" is input, so that the instruction signals SEL[3] and SEL[4] are set to "1" and the phase adjusters 11-4 and 11-5 are selected.

In the example illustrated in FIG. 6, the weighting control unit 20 includes a NAND circuit 21, an ExOR circuit 22, a NOR circuit 23, and inverters 24, 25, 26, and 27, wherein wiring connection is made so as to realize the truth table as described above.

The control code conversion unit 30 generates, using control codes from the outside that are input via signal lines CD0, CD1, and CD2, instruction signals for instructing the weighting selection units 70 to 74 which of eight inverters to activate in two adjacent phase adjusters selected by the weighting control unit 20. The control code conversion unit 30 supplies the instruction signals to the weighting selection units 70, 72 and 74 via signal lines EN0, EN1, EN2, EN3, EN4, EN5, EN6, and EN7. Moreover, the control code conversion unit 30 supplies the instruction signals to the weighting selection units 71, 73 via signal lines ENX0, ENX1, ENX2, ENX3, ENX4, ENX5, ENX6, and ENX7.

FIG. 8 illustrates an example of the truth table of the control code conversion unit.

FIG. 8 illustrates a control code CODE[0] that is input via the signal line CD0, a control code CODE[1] that is input via the signal line CD1, and a control code CODE[2] that is input via the signal line CD2. FIG. 8 also illustrates instruction signals EN[0], EN[1], EN[2], EN[3], EN[4], EN[5], EN[6], and EN[7] that are transmitted through the signal lines EN0 to EN7. Because the instruction signals transmitted through the signal lines ENX0 to ENX7 each have a value opposite to the value of each of the instruction signals EN[0] to EN[7] (e.g., when the instruction signal EN[0] is "0", ENX[0] is "1"), the illustration thereof is omitted.

For example, when all the control codes CODE[0] to CODE[2] are "0", all the instruction signals EN[0] to EN[7] are "1". The weighting selection units 70 to 74 that have received such instruction signals activate all the eight inverters in one of two phase adjusters selected by the instruction signals of the weighting control unit 20, and deactivate all the inverters in the other phase adjuster.

Moreover, when the control code CODE[0] is "1" and the control codes CODE[1] and CODE[2] are "0", the instruction signal EN[0] is "0" and the instruction signals EN[1] to EN[7] are "1". In this case, in one of two phase adjusters selected by the instruction signals of the weighting control unit 20, one inverter is activated, while in the other phase adjuster, seven inverters are activated.

In the example illustrated in FIG. 6, the control code conversion unit 30 includes NAND circuits 31, 32, 33, and 34 and NOR circuits 35, 36, 37, and 38. Moreover, the control code conversion unit 30 includes inverters 39, 40, 41, 42, 43, 44, 45, 46, 47, 48, 49, 50, 51, 52, 53, 54, 55, 56, 57, and 58 and selectors 59, 60, 61, 62, 63, 64, 65, and 66.

Note that the selectors 59 to 66 receive a control code from the signal line CD3 via the inverters 39 and 40. The selector 59 outputs a potential level "0" of the ground line VSS when the control code input is "1", and outputs a potential level "1" of the power supply voltage when the control code is "0". The selectors 60 to 66, when the control code input is "1", select and output a signal that is obtained by inverting a signal that is input to one input terminal by the inverters 44 to 50 and is input to the other input terminal.

With regard to each element of the above-described control code conversion unit 30, wiring connection is made so as to realize the truth table as illustrated in FIG. 8.

The weighting selection units 70 to 74 select eight inverters to operate in the phase adjusters 11-1 to 11-5, in accordance with the instruction signals from the weighting control unit 20 and the control code conversion unit 30.

The weighting selection units 70 to 74 receive, as an input, instruction signals from the weighting control unit 20 and the control code conversion unit 30 via the signal lines SEL0 to SEL4, EN0 to EN7, and ENX0 to ENX7. Then, the weighting selection units 70 to 74 supply control signals to a total of 40 inverters of the phase adjusters 11-1 to 11-5 via the signal lines ENP0, ENP1, ENP2, ENP3, and ENP4 and signal lines ENN0, ENN1, ENN2, ENN3, and ENN4.

Note that each of five signal lines ENP0 to ENP4 conveys eight signals to control the eight inverters in their corresponding phase adjusters 11-1 to 11-5. This also applies to signal lines ENN0 to ENN4.

The signal lines ENP0 to ENP4 are connected to the gates of pMOSs Tr2 of the inverters Ia1 to Ian and inverters Ib1 to Ibn illustrated in FIG. 1 (n=8 when the phase adjustment control unit 14 of FIG. 6 is used). The signal lines ENN0 to ENN4 are connected to the gates of nMOSs Tr3.

Figure 9:
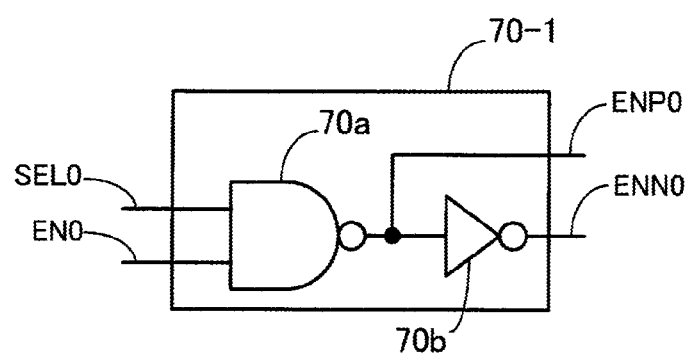
FIG. 9 illustrates a part of a weighting selection unit.

FIG. 9 illustrates a part of the weighting selection unit.

For example, the weighting selection unit 70 includes eight circuits 70-1, and FIG. 9 illustrates one of them. The circuit 70-1 has a NAND circuit 70a and an inverter 70b. The signal line SEL0 is connected to one input terminal of the NAND circuit 70a, and the signal line EN0 is connected to the other input terminal. The output terminal of the NAND circuit 70a is connected to the signal line ENP0 and the input terminal of the inverter 70b. The output terminal of the inverter 70b is connected to the signal line ENN0.

FIG. 10 illustrates an example of the truth table of the weighting selection unit.

In FIG. 10, for example, for the circuit 70-1 as illustrated in FIG. 9, there are illustrated an instruction signal SEL that is supplied from the weighting control unit 20 via the signal line SEL0 and an instruction signal EN that is supplied from the control code conversion unit 30 via the signal line EN0. There are also illustrated a control signal ENP that is output via the signal line ENP0 and a control signal ENN that is output via the signal line ENN0, from the circuit 70-1.

For example, when the instruction signal SEL is "0", the control signal ENP is "1" and the control signal ENN is "0" regardless of the instruction signal EN. The control signal ENP is input to the gate of pMOS Tr2 as illustrated in FIG. 1. The control signal ENN is input to the gate of nMOS Tr3. Therefore, the inverter that has received such control signals ENP and ENN becomes in a deactivated state and will not operate.

When the instruction signal SEL is "1", if the instruction signal EN becomes "1", the control signal ENP becomes "0" and the control signal ENN becomes "1". The inverter that has received such control signals ENP and ENN becomes in an active state and will operate.

Each of the weighting selection units 70 to 74 includes eight circuits similar to the circuit 70-1 performing the above-described operation.

Figure 11:
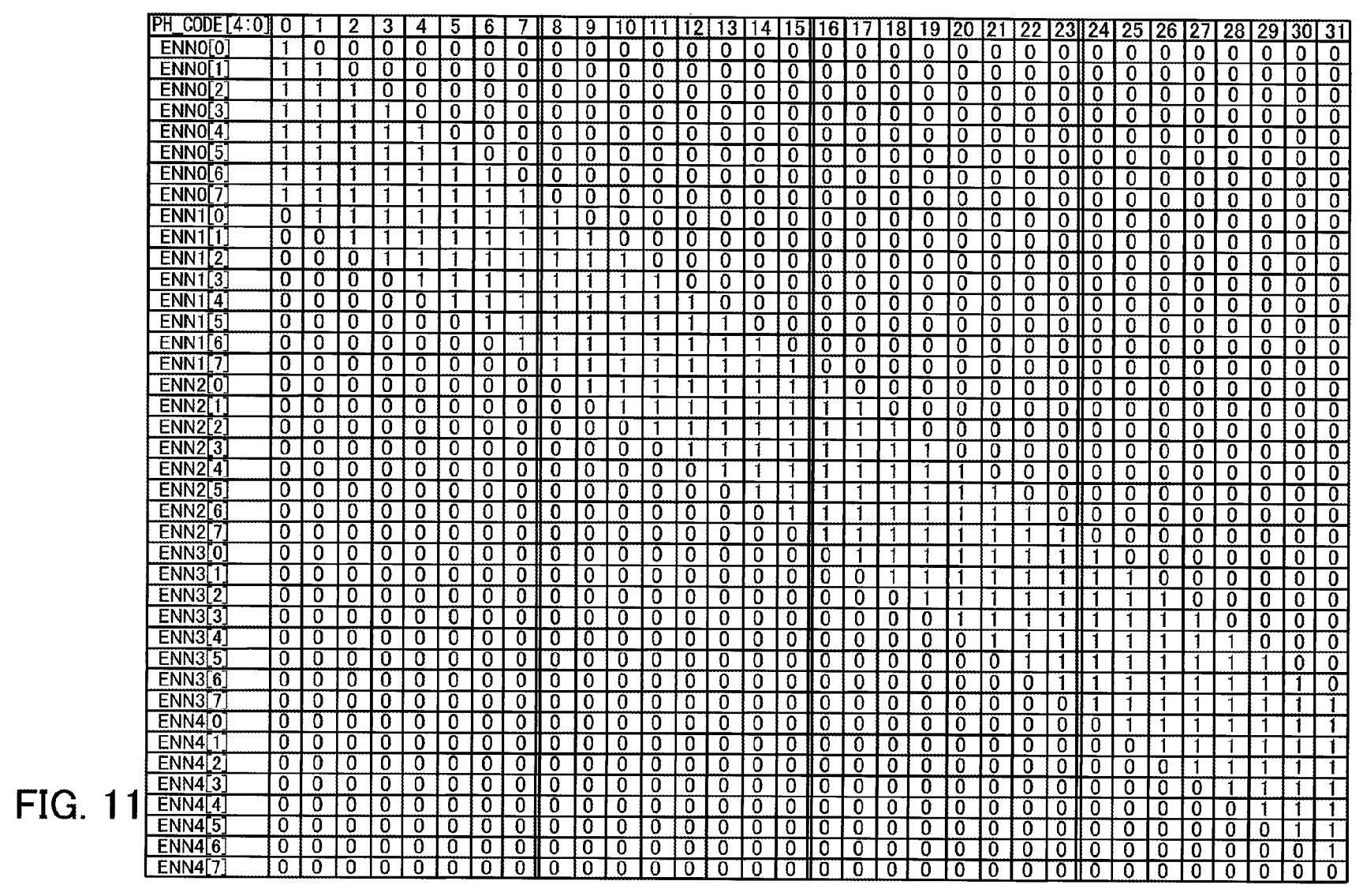

FIG. 11 is a truth table illustrating an example of control code values that are input to the phase adjustment control unit and control signals that are output therefrom.

FIG. 11 illustrates a 5-bit control code PH_CODE[4:0] that is input via the signal lines CD0 to CD4. Note that, a signal that is input via the signal line CD0 is the least significant bit of the control code PH_CODE[4:0], and a signal that is input via the signal line CD4 is the most significant bit of the control code PH_CODE[4:0]. With the 5-bit control code PH_CODE[4:0], values from 0 to 31 are expressed and the phase may be adjusted to 32 phases.

There are also illustrated control signals ENN0[0] to ENN0[7], ENN1[0] to ENN1[7], ENN2[0] to ENN2[7], ENN3[0] to ENN3[7], and ENN4[0] to ENN4[7], which are output through the signal lines ENN0 to ENN4 each carrying eight signals.

Note that, because the control signals that are output through the signal lines ENP0 to ENP4 have opposite values of the control signals that are output through the signal lines ENN0 to ENN4, the illustration thereof is omitted.

As illustrated in FIG. 11, in each value of the control code PH_CODE[4:0], values of a total of 8 consecutive control signals are "1". In the phase adjusters 11-1 to 11-5, an inverter that has received such a control signal becomes active and will operate. Therefore, all the eight inverters in a single phase adjuster will operate, or a total of eight inverters will operate in two adjacent phase adjusters.

Thus, in each phase adjustment range of four intervals determined by a delay time of each of the delay circuits 12-1 to 12-4, a phase may be divided into eight phases and finely adjusted as illustrated in FIG. 2.

Figure 12:
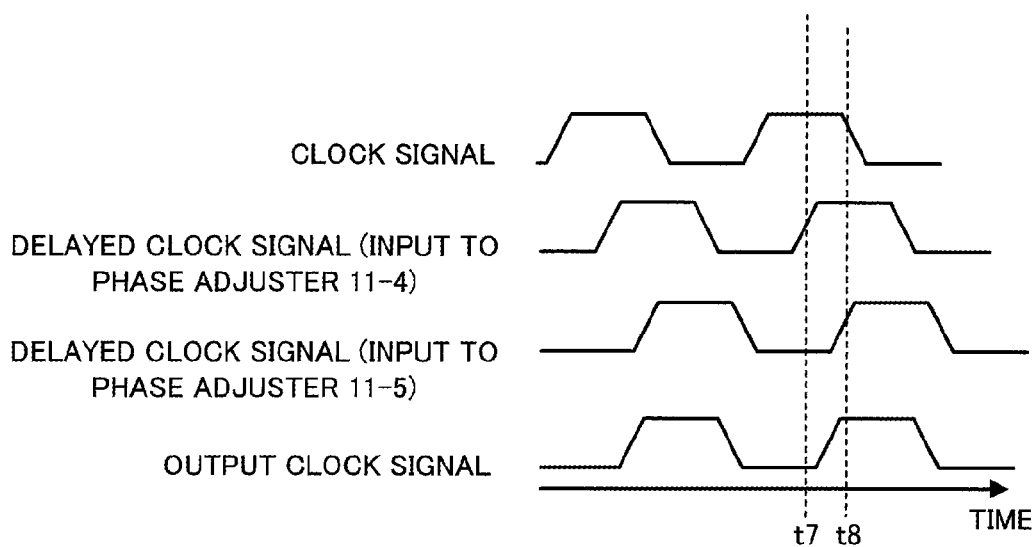
FIG. 12 illustrates an example of clock signals that are input to two phase adjusters and an output clock signal that is output from an output circuit.

FIG. 12 illustrates an example of the clock signal that is input to two phase adjusters and the output clock signal that is output from the output circuit.

FIG. 12 illustrates an example of the case where the phase adjusters 11-4 and 11-5 are selected and phase adjustment is performed. From the upper side of FIG. 12, there are illustrated a clock signal, a delayed clock signal that is delayed by the delay circuits 12-1 to 12-3 and is input to the phase adjuster 11-4, a delayed clock signal that is delayed by the delay circuits 12-1 to 12-4 and is input to the phase adjuster 11-5, and an output clock signal.

At a timing t7, the delayed clock signal that is input to the phase adjuster 11-4 becomes an H level, and at a timing t8, the delayed clock signal that is input to the phase adjuster 11-5 becomes an H level. An interval between the timings t7 to t8 serves as the phase adjustment range, and an output clock signal whose phase is adjusted in accordance with the number of active inverters among the inverters of the phase adjusters 11-4 and 11-5 is output.

During the timings t7 to t8, the delayed clock signal input to the phase adjuster 11-5 is at an L level when the delayed clock signal input to the phase adjuster 11-4 is at an H level. At this time, furthermore to the phase adjuster 11-5, the clock signal of an H level from the input terminal IN is input. For this reason, pMOSs Tc1 to Tcn (see FIG. 1) in the phase adjuster 11-5 are turned off, and therefore a current path between the phase adjuster 11-5 and the phase adjuster 11-4 is blocked and the occurrence of a shoot-through current is suppressed.

Since the phase adjustment circuit 10 of the second embodiment includes the phase adjusters 11-1 to 11-5 having a circuit similar to the phase adjustment circuit 1 of the first embodiment, a degradation of the phase adjustment accuracy due to flowing of a shoot-through current may be suppressed and phase adjustment may be performed with a high degree of accuracy. Moreover, the power consumption may be reduced because the flowing of a shoot-through current may be suppressed.

Furthermore, because the phase adjustment circuit 10 of the second embodiment includes a plurality of stages of phase adjusters 11-1 to 11-5 and a plurality of stages of delay circuits 12-1 to 12-4 that input a delayed clock signal to each of the phase adjusters 11-2 to 11-5, a fine phase adjustment may be performed in a wide range of phase adjustment.

For example, in a certain phase adjustment range, the phase adjusters 11-1 and 11-2 may perform phase adjustment with this range being divided into eight phase adjustment ranges, while in a phase adjustment range adjacent to this phase adjustment range, the phase adjusters 11-2 and 11-3 may perform similar phase adjustment. The phase adjustment circuit 10 of FIG. 5, because it includes five phase adjusters 11-1 to 11-5, can perform a total of 32 phase adjustments in four consecutive phase adjustment ranges with each adjustment range being divided into eight.

Note that, in the above-described example, five phase adjusters 11-1 to 11-5 are provided, but not limited to this number, and the phase adjustment range may be expanded by further increasing the number of phase adjusters. For example, when the number of phase adjusters is set to m and the number of inverters included in each phase adjuster is set to n, n×(m−1) phase adjustments are possible.

Third Embodiment

Figure 13:
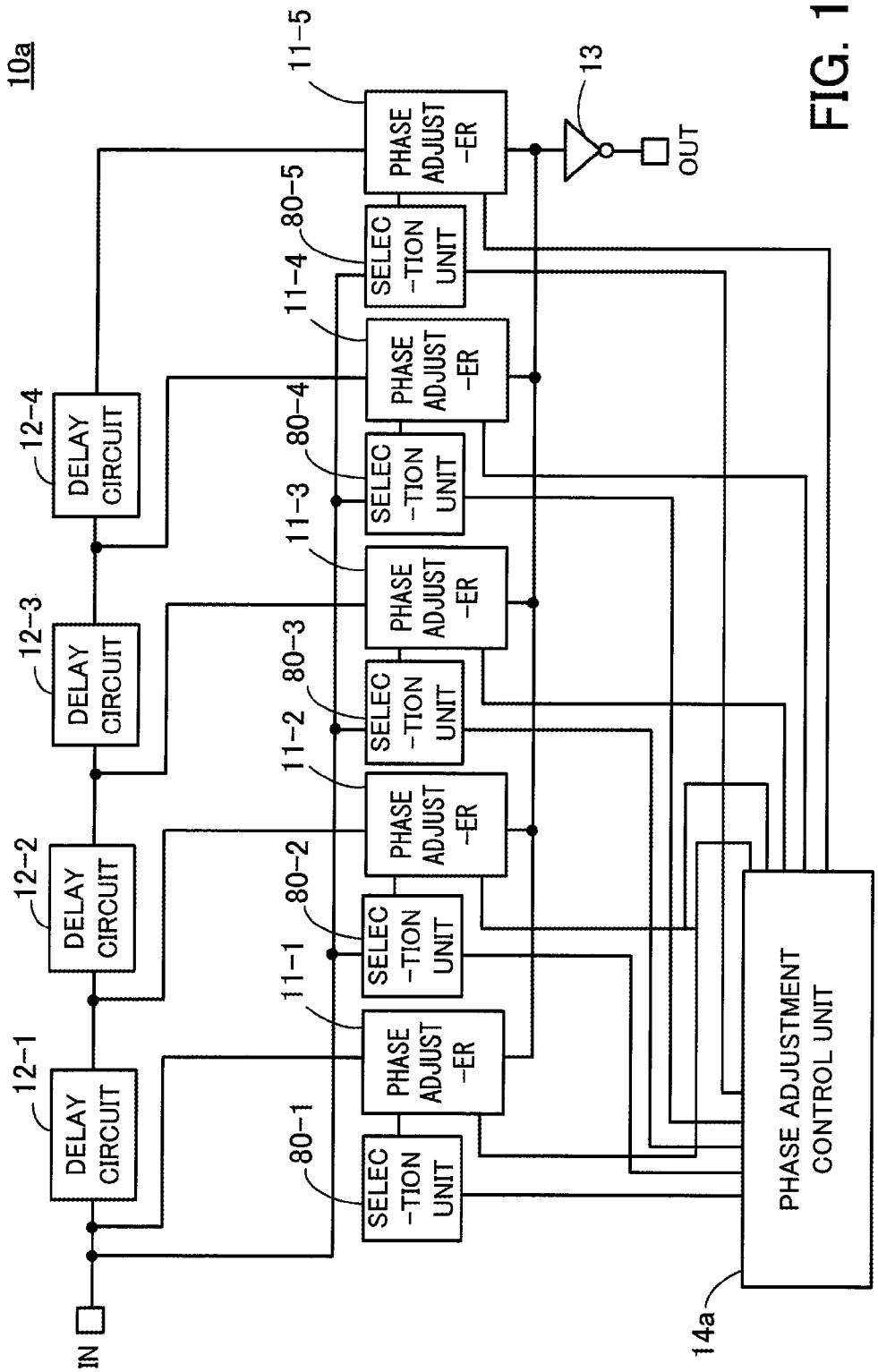
FIG. 13 illustrates an example of a phase adjustment circuit of a third embodiment.

FIG. 13 illustrates an example of a phase adjustment circuit of a third embodiment.

A component similar to the component of the phase adjustment circuit 10 of the second embodiment illustrated in FIG. 5 is attached with the same reference numeral and the description thereof is omitted.

Moreover, also in a phase adjustment circuit 10a of the third embodiment, the phase adjuster 11-1 among the phase adjusters 11-1 to 11-5 has a circuit similar to the circuit of the phase adjuster 2 illustrated in FIG. 1. Moreover, the phase adjusters 11-2 to 11-5 have a circuit similar to the circuit of the phase adjuster 3 illustrated in FIG. 1.

The phase adjustment circuit 10a, unlike the phase adjustment circuit 10 of the second embodiment, includes selection units 80-1, 80-2, 80-3, 80-4, and 80-5.

The selection units 80-2 to 80-5 select, in accordance with control signals from a phase adjustment control unit 14a, whether or not a clock signal that is input from the input terminal IN is supplied to the phase adjusters 11-2 to 11-5.

Note that, in the example illustrated in FIG. 13, the selection unit 80-1 connected to the first-stage phase adjuster 11-1 is not connected to the input terminal IN. During phase adjustment using the phase adjuster 11-1, the selection unit 80-1 connects the power supply line VDD or the ground line VSS to pMOSs Ta1 to Tan and nMOSs Tb1 to Tbn (see FIG. 1) to turn on these transistors. Therefore, a clock signal before being delayed need not be input to the phase adjuster 11-1.

The phase adjustment control unit 14a controls any one of the selection units 80-2 to 80-5 to supply a clock signal to the corresponding one of the phase adjusters 11-2 to 11-5. Moreover, the phase adjustment control unit 14a outputs control signals for determining which inverters in each of the phase adjusters 11-1 to 11-5 are activated.

Hereinafter, an example of the selection units 80-1 to 80-5 and phase adjustment control unit 14a is described.

Figure 14:
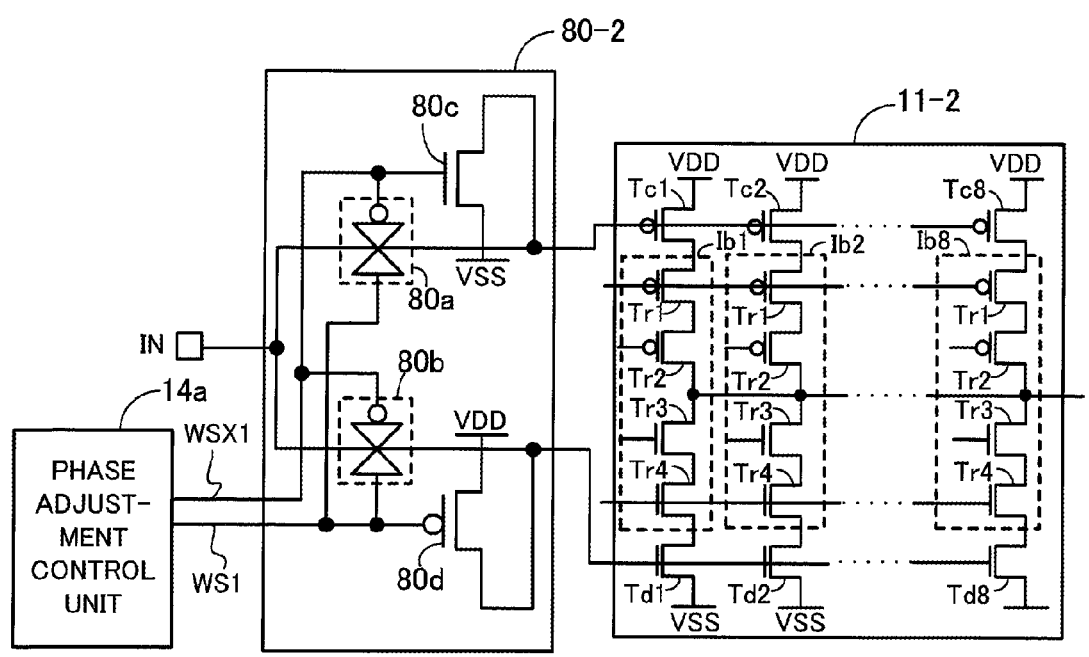
FIG. 14 illustrates an example of a selection unit.

FIG. 14 illustrates an example of the selection unit.

FIG. 14 illustrates an exemplary circuit of the selection unit 80-2 and an example of the phase adjuster 11-2 connected thereto (the number of inverters n=8). The other selection units 80-1 and 80-3 to 80-5 also have a similar circuit. However, as described above, the selection unit 80-1 is not connected to the input terminal IN.

The selection unit 80-2 has transfer gates 80a and 80b, an nMOS 80c, and a pMOS 80d.

The transfer gates 80a and 80b are provided between the input terminal IN that receives a clock signal and the phase adjuster 11-2. The gates of the transfer gates 80a and 80b on a pMOS side (on the upper side in FIG. 14) are connected to a signal line WSX1, and the gates on an nMOS side (on the lower side in FIG. 14) are connected to a signal line WS1. The signal lines WS1 and WSX1 propagate complementary control signals coming from the phase adjustment control unit 14a.

As for nMOS 80c, the drain is connected to a signal line between the transfer gate 80a and the phase adjuster 11-2, and the source is connected to the ground line VSS. Moreover, the gate of nMOS 80c is connected to the signal line WSX1.

As for pMOS 80d, the drain is connected to a signal line between the transfer gate 80b and the phase adjuster 11-2 and the source is connected to the power supply line VDD. Moreover, the gate of pMOS 80d is connected to the signal line WS1.

When from the phase adjustment control unit 14a, via the signal lines WS1 and WSX1, "0" is input to the gates of the transfer gates 80a and 80b on the pMOS side and "1" is input to the gates on the nMOS side, the clock signal from the input terminal IN is supplied to the phase adjuster 11-2. The phase adjuster 11-2 includes pMOSs Tc1 to Tc8 and nMOSs Td1 to Td8, and a clock signal is supplied to the gates of these transistors. Note that, at this time, nMOS 80c and pMOS 80d are turned off. Thus, the phase adjuster 11-2 functions as the phase adjuster 3 illustrated in FIG. 1.

On the other hand, when from the phase adjustment control unit 14a, via the signal lines WS1 and WSX1, "1" is input to the gates of the transfer gates 80a and 80b on the pMOS side and "0" is input to the gates on the nMOS side, the transfer gates 80a and 80b will not pass the clock signal. At this time, because nMOS 80c and pMOS 80d are turned on, the gates of pMOSs Tc1 to Tc8 in the phase adjuster 11-2 are set to the earth potential and the power supply voltage is applied to the gates of nMOSs Td1 to Td8 and thus both pMOSs Tc1 to Tc8 and nMOSs Td1 to Td8 are turned on. Thus, the phase adjuster 11-2 functions as the phase adjuster 2 illustrated in FIG. 1.

Next, an example of the phase adjustment control unit 14a in the phase adjustment circuit 10a of the third embodiment is illustrated.

Figure 15:
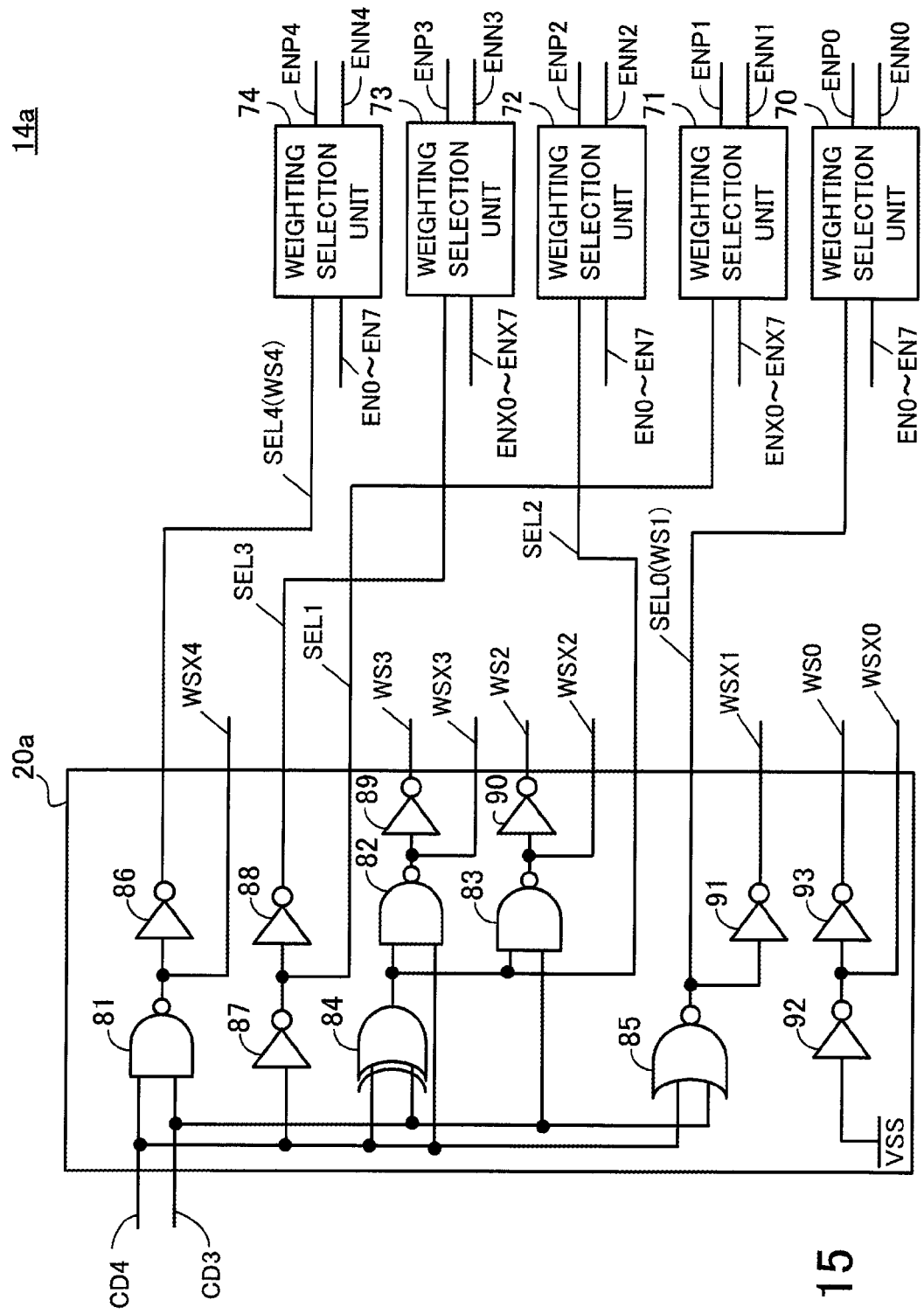
FIG. 15 illustrates an example of a phase adjustment control unit.

FIG. 15 illustrates an example of the phase adjustment control unit.

FIG. 15 illustrates an exemplary circuit diagram of the phase adjustment control unit 14a in the case where five phase adjusters 11-1 to 11-5 illustrated in FIG. 13 each include eight inverters. Note that a component similar to the component of the phase adjustment control unit 14 illustrated in FIG. 6 is attached with the same reference numeral and the description thereof is omitted. Moreover, because the same unit as the control code conversion unit 30 of the phase adjustment control unit 14 illustrated in FIG. 6 is used, the illustration thereof is omitted.

In the phase adjustment control unit 14a, a weighting control unit 20a differs from the weighting control unit 20 of the phase adjustment control unit 14 in the second embodiment.

The weighting control unit 20a generates instruction signals for instructing the weighting selection units 70 to 74 which two of five phase adjusters 11-1 to 11-5 to select, using control codes that are input from the outside via the signal lines CD3 and CD4. The weighting control unit 20 supplies the generated instruction signals to the weighting selection units 70 to 74 via the signal lines SEL0, SEL1, SEL2, SEL3, and SEL4.

Moreover, the weighting control unit 20a generates control signals that are supplied to the selection units 80-1 to 80-5 illustrated in FIG. 13, in accordance with control codes that are input via the signal lines CD3 and CD4. The weighting control unit 20a supplies the generated control signals to the selection units 80-1 to 80-5 via the signal lines WS0, WS1, WS2, WS3, WS4, WSX0, WSX1, WSX2, WSX3, and WSX4.

The signal lines WS0 and WSX0 are connected to the selection unit 80-1, and the signal lines WS1 and WSX1 are connected to the selection unit 80-2. Moreover, the signal lines WS2 and WSX2 are connected to the selection unit 80-3, the signal lines WS3 and WSX3 are connected to the selection unit 80-4, and the signal lines WS4 and WSX4 are connected to the selection unit 80-5.

Note that, in the example of FIG. 15, the signal line WS1 is shared with the signal line SEL0 and the signal line WS4 is shared with the signal line SEL4.

Signals propagating over the signal lines WS0 to WS4 and signals propagating over the signal lines WSX0 to WSX4 have a complementary relationship with each other. Connection of the signal lines WS0 to WS4 and WSX0 to WSX4 to the selection units 80-1 to 80-5 is the same as the example of the connection of the signal lines WS1 and WSX1 to the selection unit 80-2 illustrated in FIG. 14.

FIG. 16 illustrates an example of the truth table of the weighting control unit.

In the truth table, there are illustrated the control codes CODE[3] and CODE[4] that are input via the signal lines CD3 and CD4 and the instruction signals SEL[0], SEL[1], SEL[2], SEL[3], and SEL[4] that are transmitted through the signal lines SEL0 to SEL4. In the truth table, there are further illustrated the control signals WS[0], WS[1], WS[2], WS[3], and WS[4] that are transmitted through the signal lines WS0 to WS4. Note that, because the control signals transmitted through the signal lines WSX0 to WSX4 have opposite values to those of the control signals WS[0] to WS[4] (e.g., when the control signal WS[0] is "0", the signal line WSX[0] is "1"), the illustration thereof is omitted.

For example, when both the control codes CODE[3] and CODE[4] are "0", the control signal WS[1] is "1" and the other control signals are "0". In this case, among the selection units 80-1 to 80-5, the selection unit 80-2 will supply a clock signal coming from the input terminal IN to the gates of pMOSs Tc1 to Tc8 and nMOSs Td1 to Td8 of the phase adjuster 11-2.

The other selection units 80-1 and 80-3 to 80-5 set the gates of pMOSs Tc1 to Tc8 and nMOSs Td1 to Td8 in the phase adjusters 11-1 and 11-3 to 11-5 to the earth potential or apply the power supply voltage to the gates to turn on pMOSs Tc1 to Tc8 and nMOSs Td1 to Td8.

As illustrated in FIG. 16, with a pattern of each of the control codes CODE[3] and CODE[4], only one of the control signals WS[0] to WS[4] is set to "1". Therefore, during phase adjustment, a clock signal from the input terminal IN is supplied to one of the phase adjusters 11-1 to 11-5.

Thus, power consumption may be reduced further than the phase adjustment circuit 10 of the second embodiment.

The relationship between the values of the control codes CODE[3] and CODE[4] and the values of the instruction signals SEL[0] to SEL[4] illustrated in FIG. 16 is the same as the example of the truth table of the weighting control unit 20 of the second embodiment illustrated in FIG. 7.

The weighting control unit 20a includes NAND circuits 81, 82, and 83, an ExOR circuit 84, a NOR circuit 85, inverters 86, 87, 88, 89, 90, 91, 92, and 93 as illustrated in FIG. 15. Then, with regard to each element, wiring connection is made so as to realize the truth table as in FIG. 16.

Note that the relationship between the control codes CODE[0] to CODE[4] and the control signals transmitted through the signal lines ENN0 to ENN4 is the same as the relationship illustrated in FIG. 11.

In the phase adjustment circuit 10a of the third embodiment as described above, the similar effect to the effect of the phase adjustment circuits 1 and 10 of the first and second embodiments may be obtained. Furthermore, in the phase adjustment circuit 10a, because a clock signal supplied to the transistor for preventing a shoot-through current is supplied to one of the phase adjusters 11-1 to 11-5, power consumption may be reduced further.

Fourth Embodiment

Figure 17:
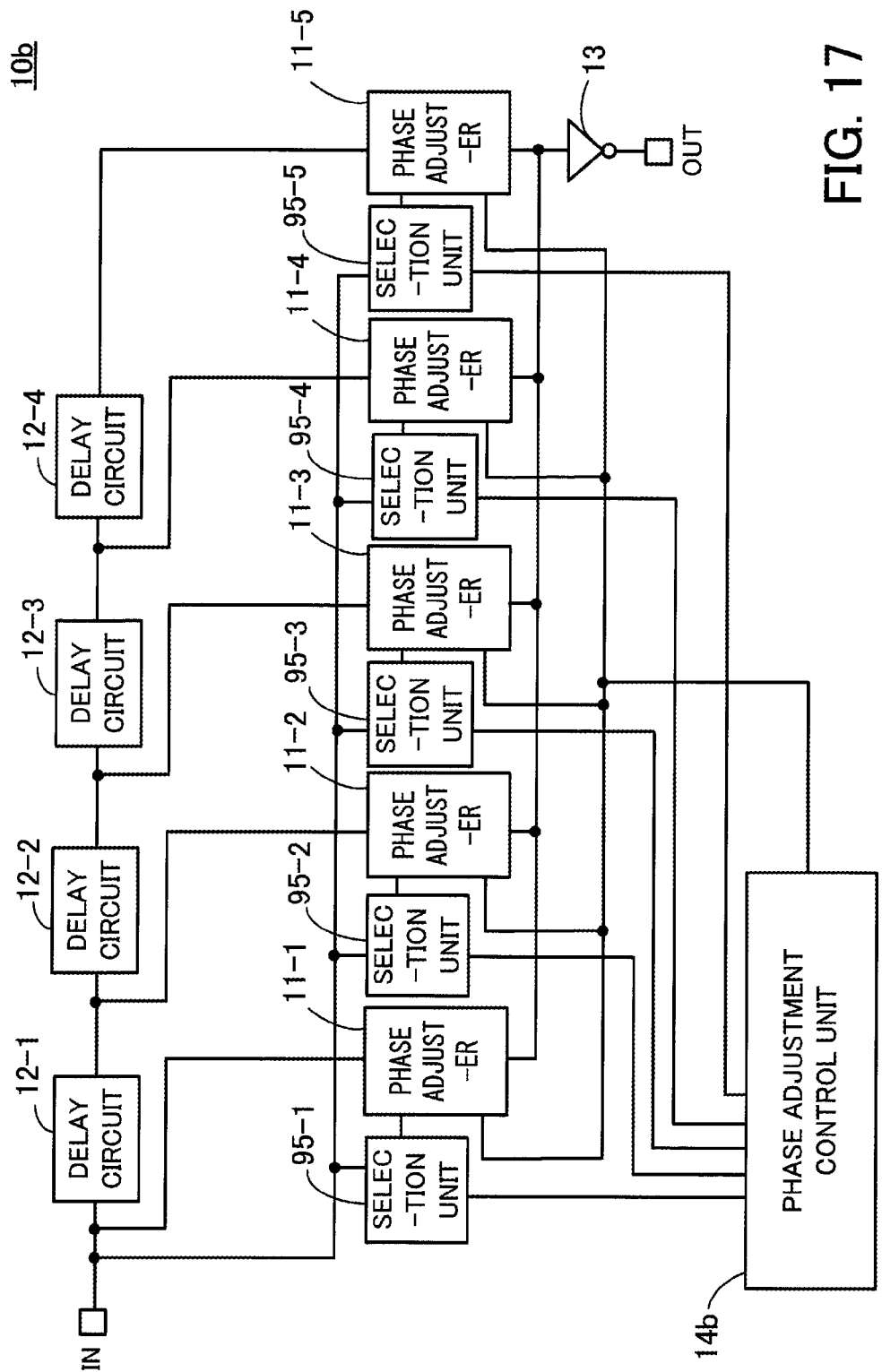
FIG. 17 illustrates an example of a phase adjustment circuit of a fourth embodiment.

FIG. 17 illustrates an example of a phase adjustment circuit of a fourth embodiment.

A component similar to the component of the phase adjustment circuit 10a of the third embodiment illustrated in FIG. 13 is attached with the same reference numeral and the description thereof is omitted.

Moreover, also in a phase adjustment circuit 10b of the fourth embodiment, the phase adjuster 11-1 among the phase adjusters 11-1 to 11-5 has a circuit similar to the circuit of the phase adjuster 2 illustrated in FIG. 1. Moreover, the phase adjusters 11-2 to 11-5 have a circuit similar to the circuit of the phase adjuster 3 illustrated in FIG. 1.

In the phase adjustment circuit 10b, the function to select a phase adjuster to operate is shifted from the above-described weighting selection units 70 to 74 to selection units 95-1, 95-2, 95-3, 95-4, and 95-5. Thus, the circuit size of the phase adjustment control unit 14b may be reduced (the detail will be described later).

Figure 18:
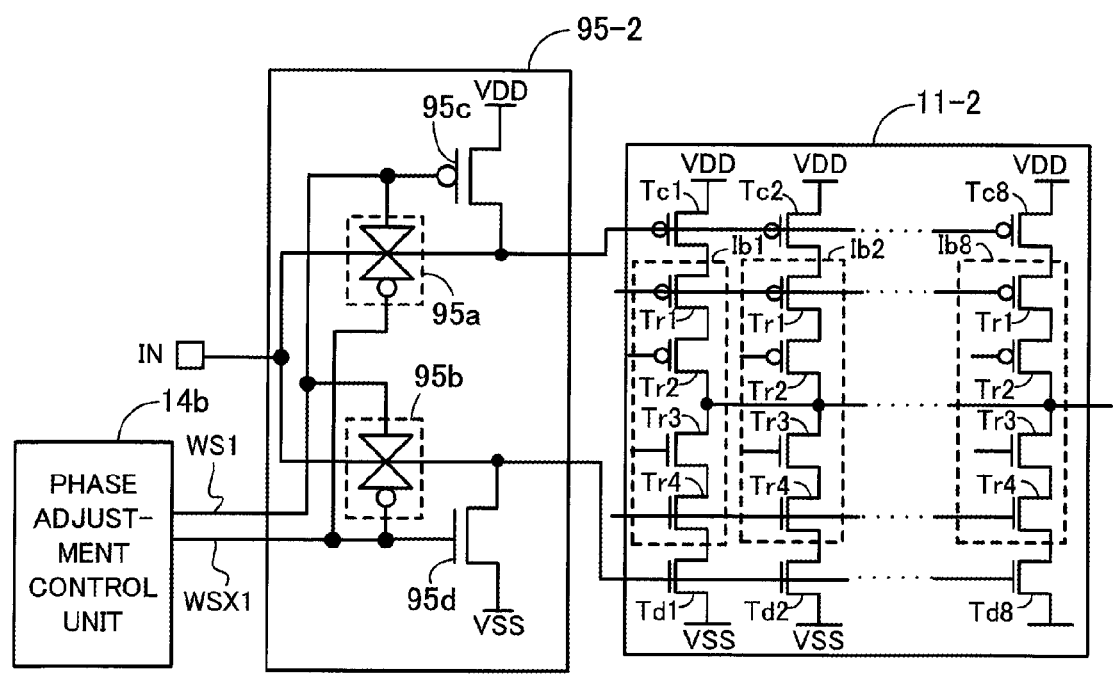
FIG. 18 illustrates an example of a selection unit.

FIG. 18 illustrates an example of the selection unit.

FIG. 18 illustrates an exemplary circuit of the selection unit 95-2. The other selection units 95-1 and 95-3 to 95-5 have a similar circuit.

The selection unit 95-2 includes transfer gates 95a and 95b, a pMOS 95c, and an nMOS 95d.

The transfer gates 95a and 95b are provided between the input terminal IN that receives a clock signal and the phase adjuster 11-2. The gates of the transfer gates 95a and 95b on a pMOS side (on the lower side in FIG. 18) are connected to the signal line WSX1, and the gates on an nMOS side (on the upper side in FIG. 18) are connected to the signal line WS1. The signal lines WS1 and WSX1 propagate complementary control signals coming from the phase adjustment control unit 14b.

As for pMOS 95c, the drain is connected to a signal line between the transfer gate 95a and the phase adjuster 11-2, and the source is connected to the power supply line VDD. Moreover, the gate of pMOS 95c is connected to the signal line WS1.

As for nMOS 95d, the drain is connected to a signal line between the transfer gate 95b and the phase adjuster 11-2, and the source is connected to the ground line VSS. Moreover, the gate of nMOS 95d is connected to the signal line WSX1.

When from the phase adjustment control unit 14b, via the signal lines WS1 and WSX1, "0" is input to the gates of the transfer gates 95a and 95b on the pMOS side and "1" is input to the gates on the nMOS side, the clock signal from the input terminal IN is supplied to the phase adjuster 11-2. The phase adjuster 11-2 includes pMOSs Tc1 to Tc8 and nMOSs Td1 to Td8, and the clock signal is supplied to the gates of these transistors. Note that, at this time, pMOS 95c and nMOS 95d are turned off. Thus, the phase adjuster 11-2 functions as the phase adjuster 2 or the phase adjuster illustrated in FIG. 1. However, when the phase adjuster 11-2 functions as the phase adjuster 2, a clock signal before being delayed from the input terminal IN will be input also to pMOSs Ta1 to Tan and nMOSs Tb1 to Tbn of FIG. 1.

On the other hand, when from the phase adjustment control unit 14b, via the signal lines WS1 and WSX1, "1" is input to the gates of the transfer gates 95a and 95b on the pMOS side and "0" is input to the gates on the nMOS side, the transfer gates 95a and 95b will not pass the clock signal. At this time, because pMOS 95c and nMOS 95d are turned on, the gates of pMOSs Tc1 to Tc8 in the phase adjuster 11-2 are set to the power supply voltage and the gates of nMOSs Td1 to Td8 are set to the earth potential, and thus both pMOSs Tc1 to Tc8 and nMOSs Td1 to Td8 are turned off. In this case, regardless of the control signals that are input to the gates of pMOS Tr2 and nMOS Tr3 of the inverters Ib1 to Ib8, the inverters Ib1 to Ib8 become in a deactivated state and will not operate. That is, the phase adjuster 11-2 becomes in a non-selected state and will not operate.

In this manner, in the phase adjustment circuit 10b of the fourth embodiment, the selection units 95-1 to 95-5 have a function of selection of the phase adjusters 11-1 to 11-5 performed by the weighting selection units 70 to 74 illustrated in the above-described embodiment. Such modified selection units 95-1 to 95-5 have a function to select phase adjusters to operate among the phase adjusters 11-1 to 11-5 in accordance with control signals from the phase adjustment control unit 14b. Moreover, the selection units 95-1 to 95-5 have a function not only to supply a control signal (a clock signal before being delayed) for preventing a shoot-through current to only two phase adjusters to operate, but also to be able to deactivate all the phase adjusters not to operate.

Thus, in the phase adjustment control unit 14b, the weighting selection units 70 to 74 need not be provided. However, the output connection destination thereof differs from that of the above-described weighting control units 20 and 20a. Moreover, because a control signal for preventing a shoot-through current is supplied to only two limited phase adjusters to operate, a reduction of power consumption as well as a reduction of area may be achieved. The detail of the phase adjustment control unit 14b not provided with the weighting selection units 70 to 74 will be illustrated below.

Figure 19:
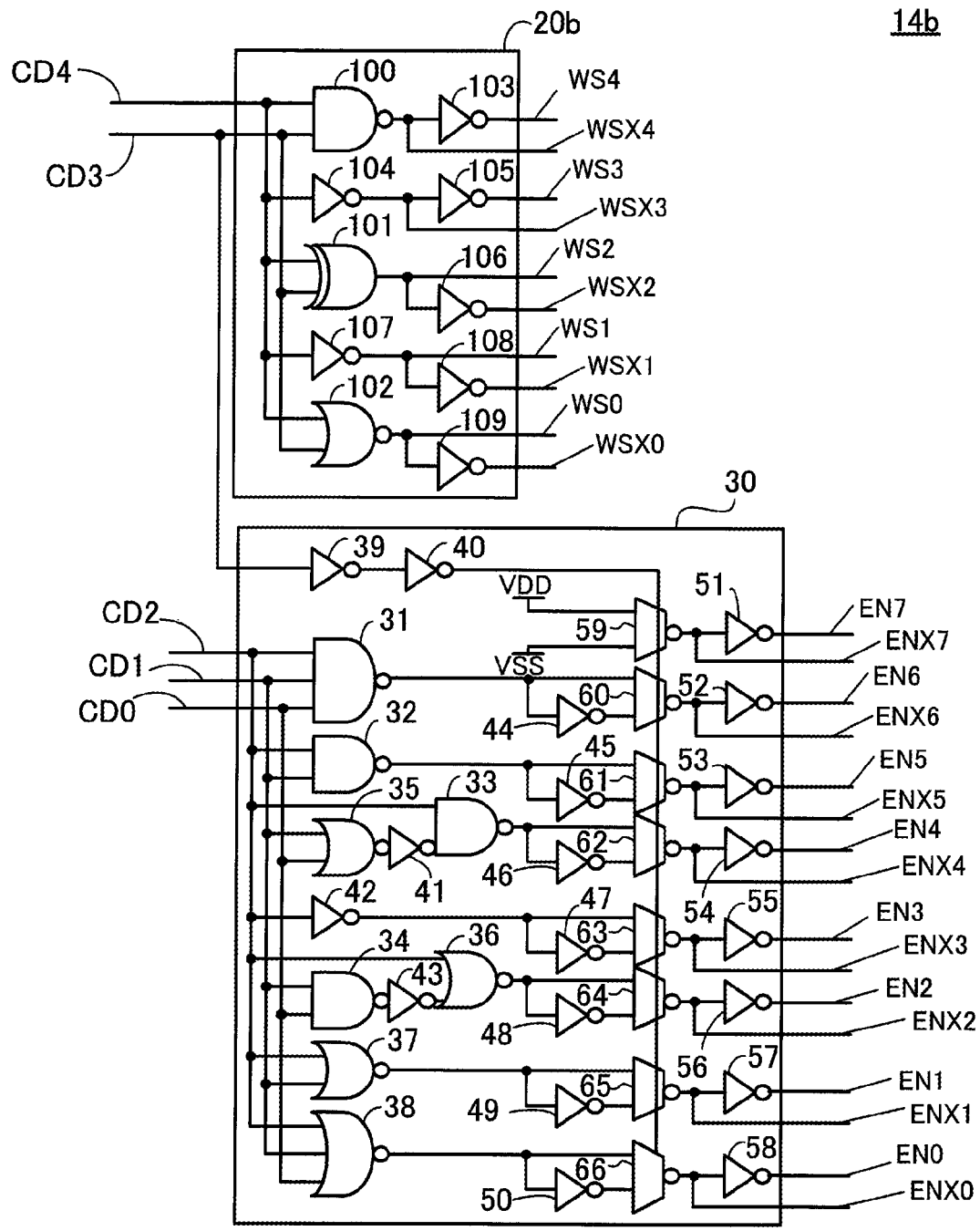
FIG. 19 illustrates an example of a phase adjustment control unit.

FIG. 19 illustrates an example of the phase adjustment control unit.

FIG. 19 illustrates an exemplary circuit diagram of the phase adjustment control unit 14b in the case where five phase adjusters 11-1 to 11-5 illustrated in FIG. 17 each have eight inverters. Note that a component similar to the component of the phase adjustment control unit 14 illustrated in FIG. 6 is attached with the same reference numeral and the description thereof is omitted.

In the phase adjustment control unit 14b, the supply destinations of control signals generated by a weighting control unit 20b are the selection units 95-1 to 95-5, not the above-described weighting selection units 70 to 74. Then, the weighting control unit 20b is modified from the weighting control unit 20 of the phase adjustment control unit 14 of the second embodiment so as to generate complementary signals.

The weighting control unit 20b receives control codes from the outside via the signal lines CD3 and CD4, and generates control signals for instructing the selection units 95-1 to 95-5 to supply a clock signal to which two adjacent phase adjusters of the phase adjusters 11-1 to 11-5.

The weighting control unit 20b supplies the generated control signals to the selection units 95-1 to 95-5 via the signal lines WS0, WS1, WS2, WS3, WS4, WSX0, WSX1, WSX2, WSX3, and WSX4. The signal lines WS0 and WSX0 are connected to the selection unit 95-1, and the signal lines WS1 and WSX1 are connected to the selection unit 95-2. Moreover, the signal lines WS2 and WSX2 are connected to the selection unit 95-3, the signal lines WS3 and WSX3 are connected to the selection unit 95-4, and the signal lines WS4 and WSX4 are connected to the selection unit 95-5.

Signals propagating over the signal lines WS0 to WS4 and signals propagating over the signal lines WSX0 to WSX4 have a complementary relationship with each other. Connection of the signal lines WS0 to WS4 and WSX0 to WSX4 to the selection units 95-1 to 95-5 is similar to the example of the connection of the signal lines WS1 and WSX1 to the selection unit 95-2 illustrated in FIG. 18.

FIG. 20 illustrates an example of the truth table of the weighting control unit.

In the truth table, there are illustrated the control codes CODE[3] and CODE[4] that are input via the signal lines CD3 and CD4 and the control signals WS[0], WS[1], WS[2], WS[3], and WS[4] that are transmitted through the signal lines WS0 to WS4. Note that, because the control signals transmitted through the signal lines WSX0 to WSX4 have opposite vales of the values of the control signals WS[0] to WS[4] (e.g., when the control signal WS[0] is "0", the signal line WSX[0] is "1"), the illustration thereof is omitted.

For example, when both the control codes CODE[3] and CODE[4] are "0", the control signals WS[0] and WS[1] are "1" and the other control signals are "0". In this case, the selection units 95-1 and 95-2 will supply a clock signal to the gates of the transistors for blocking a shoot-through current (pMOSs Tc1 to Tcn and nMOSs Td1 to Tdn in the example of the phase adjuster 11-2 of FIG. 18) of the adjacent phase adjusters 11-1 and 11-2. Then, the other selection units 95-3 to 95-5 set the gates of the transistors for blocking a shoot-through current in the phase adjusters 11-3 to 11-5 to the earth potential or apply the power supply voltage to turn off the transistors for blocking a shoot-through current. Thus, all the inverters in the phase adjusters 11-3 to 11-5 become in a deactivated state and will not operate. Accordingly, phase adjustment by the phase adjusters 11-1 and 11-2 is performed.

The weighting control unit 20b has a NAND circuit 100, an ExOR circuit 101, a NOR circuit 102, and inverters 103, 104, 105, 106, 107, 108, and 109 as illustrated in FIG. 19. Then, with regard to each element, wiring connection is made so as to realize the truth table as in FIG. 20.

The control code conversion unit 30 is the same as that of the second and third embodiments. However, because the phase adjustment control unit 14b does not include the weighting selection units 70 to 74, instruction signals from the control code conversion unit 30 are supplied directly to the phase adjusters 11-1 to 11-5.

Note that the relationship between a control code and an instruction signal is as follows.

Figure 21:
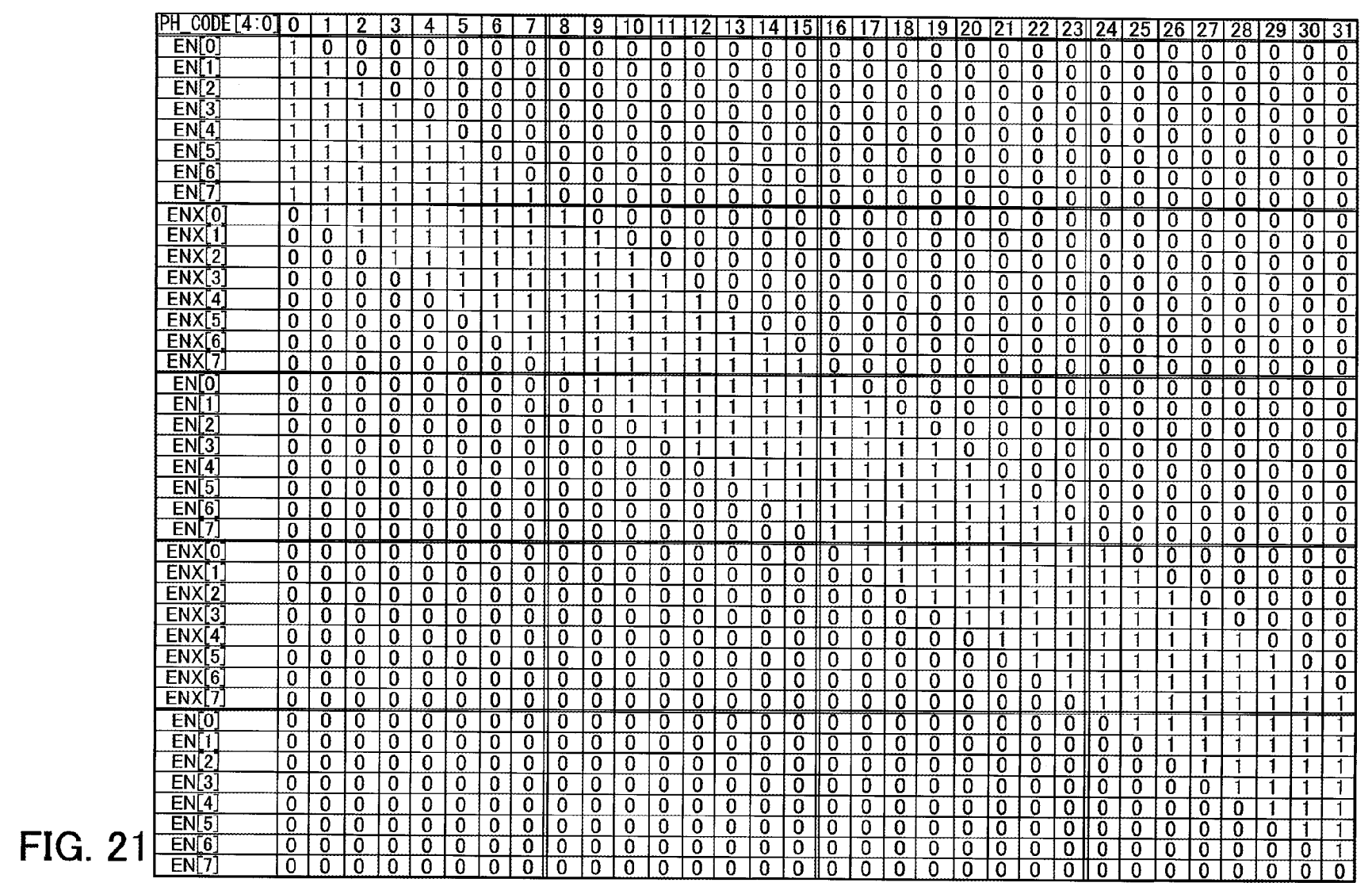

FIG. 21 is a truth table illustrating an example of the relationship between control code values and instruction signals on the signal lines EN0 to EN7 and ENX0 to ENX7.

In the truth table, there is illustrated the 5-bit control code PH_CODE[4:0] that is input via the signal lines CD0 to CD4. Note that, a signal that is input via the signal line CD0 is the least significant bit of the control code PH_CODE[4:0], and a signal that is input via the signal line CD4 is the most significant bit of the control code PH_CODE[4:0]. With the 5-bit control code PH_CODE[4:0], the values from 0 to 31 are expressed.

Moreover, the instruction signals that are output through the signal lines EN0 to EN7 and ENX0 to ENX7 are designated by EN[0] to EN[7] and ENX[0] to ENX[7].

As illustrated in FIG. 21, at each value of the control code PH_CODE[4:0], a total of eight values of the instruction signals of EN[0] to EN[7] and ENX[0] to ENX[7] are "1".

The connection between the signal lines EN0 to EN7 and ENX0 to ENX7 for propagating the instruction signals and the phase adjusters 11-1 to 11-5 is as follows.

Figure 22:
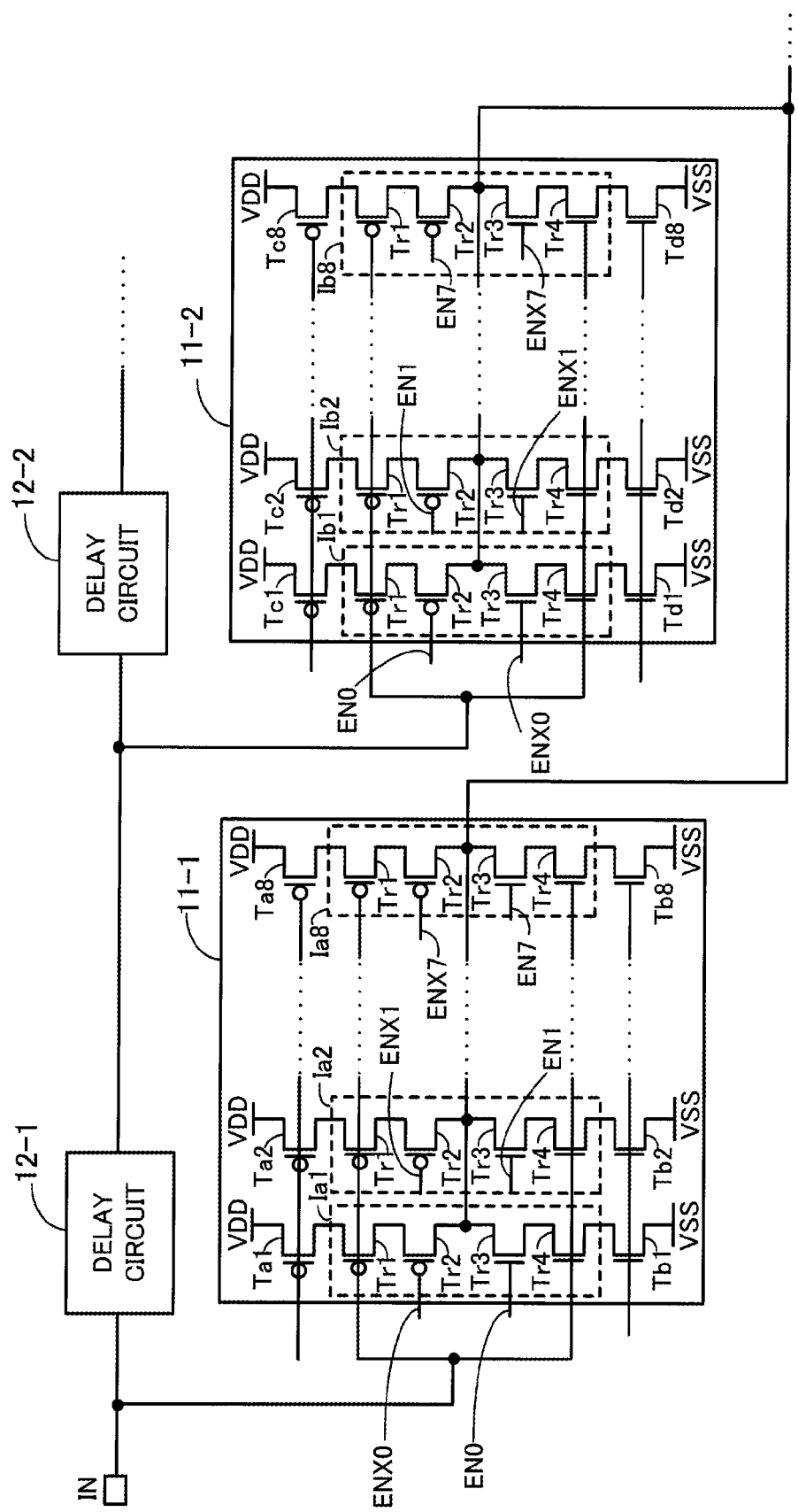
FIG. 22 illustrates an example of connection between the phase adjustment control unit and the phase adjuster.

FIG. 22 illustrates an example of the connection between the phase adjustment control unit and the phase adjuster.

In FIG. 22, there is illustrated an example of the connection between the phase adjusters 11-1, 11-2 illustrated in FIG. 17 and the signal lines EN0 to EN7 and ENX0 to ENX7. As for the selection units 95-1 and 95-2 illustrated in FIG. 17, the illustration thereof is omitted in FIG. 22.

The signal lines EN0 to EN7 are connected to the gates of the nMOSs Tr3 of the respective inverters Ia1 to Ia8 in the phase adjuster 11-1, and are connected to the gates of the pMOSs Tr2 of the respective inverters Ib1 to Ib8 in the adjacent phase adjuster 11-2. Moreover, the signal lines ENX0 to ENX7 are connected to the gates of the pMOSs Tr2 of the respective inverters Ia1 to Ia8 in the phase adjuster 11-1, and are connected to the gates of the nMOSs Tr3 of the respective inverters Ib1 to Ib8 in the adjacent phase adjuster 11-2.

Although not illustrated, as for the phase adjusters 11-3 and 11-5, connection of the signal lines EN0 to EN7 and ENX0 to ENX7 is made as with the phase adjuster 11-1. Moreover, as for the phase adjuster 11-4, connection of the signal lines EN0 to EN7 and ENX0 to ENX7 is made as with the phase adjuster 11-2.

That is, connection between the gates of pMOS and nMOS for determining whether or not to operate an inverter of a phase adjuster and the signal lines EN0 to EN7 and ENX0 to ENX7 is switched between the adjacent phase adjusters.

Because complementary instruction signals are supplied to the signal lines EN0 to EN7 and the signal lines ENX0 to ENX7, respectively, the connections as described above allows the sets of pMOS Tr2 and nMOS Tr3 of a total of eight inverters to be turned on between the adjacent phase adjusters.

For example, in the example illustrated in FIG. 22, when an instruction signal that is propagated through the signal line EN0 is "0" and an instruction signal that is propagated through the signal lines EN1 to EN7 is "1", pMOS Tr2 and nMOS Tr3 of the inverter Ia1 are turned off in the phase adjuster 11-1. Then, pMOS Tr2 and nMOS Tr3 of each of the other inverters Ia2 to Ia8 are turned on. In contrast, in the phase adjuster 11-2, pMOS Tr2 and nMOS Tr3 of the inverter Ib1 are turned on. Then, pMOS Tr2 and nMOS Tr3 of each of the other inverters Ib2 to Ib8 are turned off.

That is, when the phase adjusters 11-1 and 11-2 are selected by the above-described selection units 95-1 and 95-2, the inverters Ia2 to Ia8 are activated in the phase adjuster 11-1 and the inverter Ib1 are activated in the phase adjuster 11-2, and a total of eight inverters will operate.

By adjusting the control code as illustrated in FIG. 21, eight patterns of the number of the inverters Ia1 to Ia8 and Ib1 to Ib8 to be activated may be selected between the phase adjusters 11-1 and 11-2. Thus, in each phase adjustment range determined by the delay time of each of the delay circuits 12-1 to 12-4, a phase may be divided into eight phases and finely adjusted as illustrated in FIG. 2.

In the phase adjustment circuit 10b of the fourth embodiment as described above, an effect similar to the effect of the phase adjustment circuits 1 and 10 of the first and second embodiments may be obtained. Furthermore, because in the phase adjustment circuit 10b a clock signal supplied to a transistor for preventing a shoot-through current is supplied to two of the phase adjusters 11-1 to 11-5, not to all of them, power consumption may be reduced further.

Moreover, by providing the selection units 95-1 to 95-5 with a function to activate two of the phase adjusters 11-1 to 11-5 that are used during phase adjustment, the circuit area of the phase adjustment control unit 14b may be reduced as illustrated in FIG. 19.

The first to fourth phase adjustment circuits 1, 10, 10a, and 10b as described above are applied to an interface circuit that transmits and receives data, for example, between circuit boards, between LSIs, between a CPU and a memory, and the like.

Figure 23:
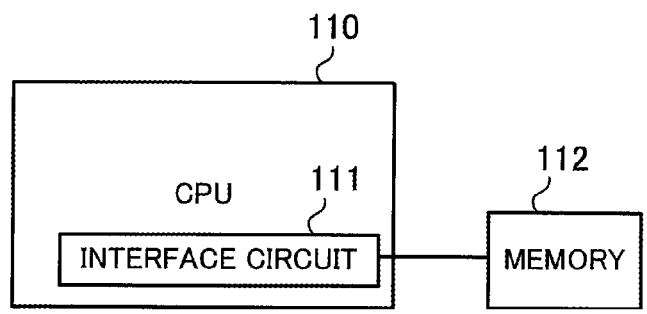
FIG. 23 illustrates an example of an interface circuit that transmits and receives data between a CPU and a memory.

FIG. 23 illustrates an example of an interface circuit that transmits and receives data between a CPU and a memory.

An interface circuit 111 is mounted, for example, on a CPU 110, and data is transmitted and received between a memory 112 and the CPU 110.

Figure 24:
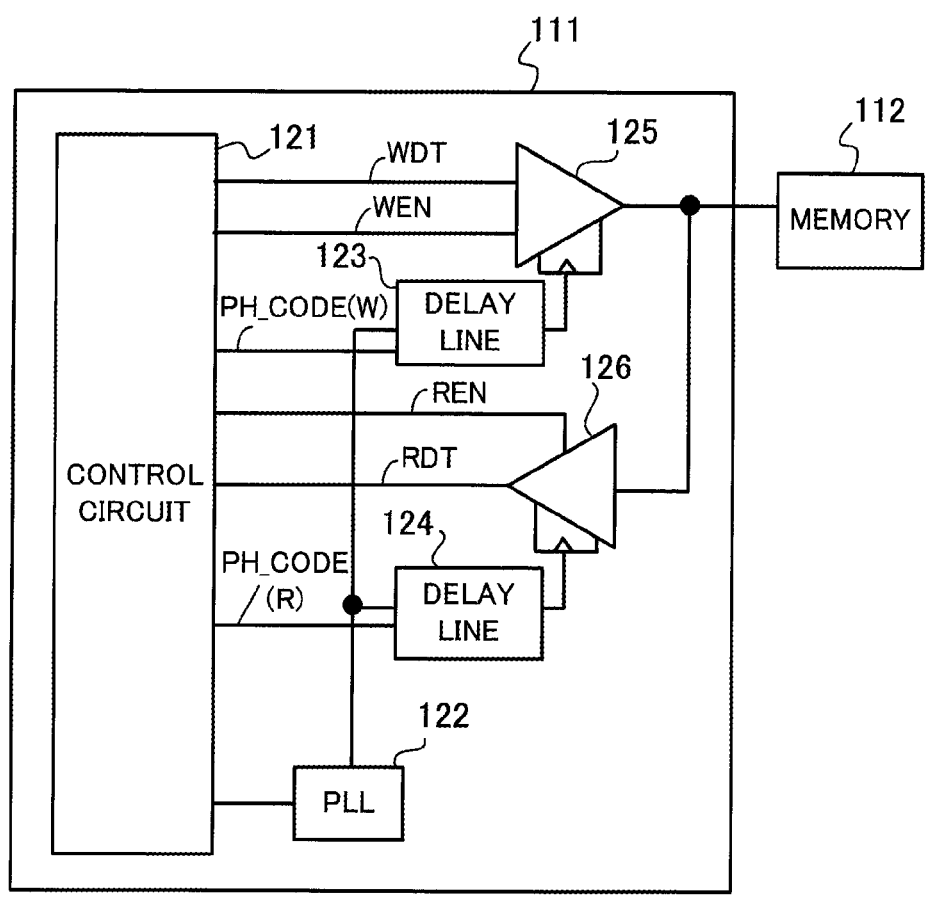
FIG. 24 illustrates an example of the interface circuit.

FIG. 24 illustrates an example of the interface circuit.

FIG. 24 illustrates an example of a memory controller for a DDR SDRAM (Double-Data-Rate Synchronous Dynamic Random Access Memory), as the interface circuit 111.

The interface circuit 111 includes a control circuit 121, a PLL (Phase Locked Loop) circuit 122, delay line circuits 123 and 124, and buffer circuits 125 and 126.

The control circuit 121 controls each unit of the interface circuit 111. The PLL circuit 122 receives a clock signal of a reference frequency, generates a clock signal obtained by dividing the received clock signal by a desired integral multiple of the reference frequency, in synchronization with the clock signal, and supplies the same to the control circuit 121 and the delay line circuits 123 and 124.

The control circuit 121 includes a DLL (Delay Locked Loop) circuit, and receives the clock signal from the PLL circuit 122 and performs phase comparison with an internal clock signal. Then, in accordance with the comparison result, the control circuit 121 generates a code for phase adjustment so that the phase of the clock signal from the PLL circuit 122 coincides with the phase of a clock inside the memory 112, and sends the same to the delay line circuits 123 and 124.

The delay line circuits 123 and 124 convert the clock signal supplied from the PLL circuit 122 to a clock signal added with a delay corresponding to the code for phase adjustment.

For example, in such delay line circuits 123 and 124, any of the phase adjustment circuits 1, 10, 10a, and 10b of the first to fourth embodiments is provided. Note that, one set of control signals from the control circuit 121 is input to the delay line circuit 123 via a signal line PH_CODE(W), and another set of control signals from the control circuit 121 is input to the delay line circuit 124 via a signal line PH_CODE(R).

The buffer 125, when a write enable signal that is supplied via a signal line WEN from the control circuit 121 is asserted, outputs data, which is supplied via a signal line WDT from the control circuit 121, to the memory 112 in synchronization with the clock signal from the delay line circuit 123.

The buffer 126, when a read enable signal that is supplied via the signal line REN from the control circuit 121 is asserted, outputs data, which is read from the memory 112, to the control circuit 121 via a signal line RDT in synchronization with the clock signal from the delay line circuit 124.

By applying the phase adjustment circuits 1, 10, 10a, and 10b of the first to fourth embodiments described above to the delay line circuits 123 and 124, the phase of the clock signal that is input from the PLL circuit 122 may be matched with the phase of the clock signal of the memory 112 with high degree of accuracy. Moreover, because a shoot-through current may be suppressed, power consumption may be reduced.

In the foregoing, one aspect of the phase adjustment circuit and interface circuit of the present invention has been described based on the embodiments, but these are just one example and are not limited to the above-described description.

According to the phase adjustment circuit and interface circuit of this disclosure, low-power and high-precision phase adjustment is possible.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A phase adjustment circuit comprising:
a first phase adjuster including a plurality of parallel-connected first inverters configured to receive an input signal to be phase-adjusted, the first inverters being activated or deactivated depending on first control signals;
a delay circuit configured to delay the input signal to be phase-adjusted by a predetermined delay time;
a second phase adjuster including a plurality of parallel-connected second inverters configured to receive the delayed input signal from the delay circuit, the second inverters being activated or deactivated depending on second control signals; and
an output circuit configured to receive output signals of the first and second phase adjusters and output a signal whose phase is adjusted within a range of the delay time,
wherein the second phase adjuster further includes a plurality of transistors that are connected to the second inverters and controlled by the input signal so as to block a current path between the first phase adjuster and the second phase adjuster during the delay time.

2. The phase adjustment circuit according to claim 1, wherein:
the first phase adjuster or the second phase adjuster is provided in plurality,
the delay circuit is provided in plurality, the plurality of delay circuits being connected in series, and
the first phase adjusters or the second phase adjusters are connected respectively to the plurality of delay circuits, so that the first phase adjusters or the second phase adjusters are supplied with the input signal with different amounts of delay.

3. The phase adjustment circuit according to claim 2, further comprising a selection unit provided for each of the first phase adjusters or the second phase adjusters, wherein
the first phase adjuster has transistors connected between each of the first inverters and a power supply line or a ground line, wherein
each of the transistors of the second phase adjuster is connected between each of the second inverters and a power supply line or a ground line, and wherein
the selection unit supplies the input signal to be phase-adjusted to each of the transistors of one of the second phase adjusters, from among the plurality of first phase adjusters and the plurality of second phase adjusters, and supplies a signal of a constant voltage level to the transistors of other second phase adjusters and the first phase adjusters to turn on the transistors.

4. The phase adjustment circuit according to claim 2, further comprising a selection unit provided for each of the first phase adjusters or the second phase adjusters, wherein
the first phase adjuster has transistors connected between each of the plurality of first inverters and a power supply line or a ground line, wherein
each of the transistors of the second phase adjusters is connected between each of the plurality of second inverters and a power supply line or a ground line, and wherein
the selection unit supplies the input signal to be phase-adjusted to each of the transistors of one set of the first phase adjuster and the second phase adjuster adjacent to each other, from among the plurality of first phase adjusters and the plurality of second phase adjusters, and supplies a signal of a constant voltage level to the transistors of other first phase adjusters and other second phase adjusters to turn off the transistors, so as to set the other first phase adjusters and the other second phase adjusters to a non-selected state.

5. The phase adjustment circuit according to claim 4, wherein
a transistor of a first conductivity type and a transistor of a second conductivity type, which activate the plurality of first inverters or the plurality of second inverters when the transistors are turned on, are connected to each of the plurality of first inverters or the plurality of second inverters, wherein
the phase adjustment circuit further includes a phase adjustment control unit configured to output identical control signals as the first control signals and the second control signals, wherein
the control signals are complementary signals, and wherein
the phase adjustment control unit supplies one of the complementary signals as a control signal of the transistor of the first conductivity type of the first phase adjuster and the transistor of the second conductivity type of the second phase adjuster adjacent thereto, and supplies another of the complementary signals as a control signal of the transistor of the second conductivity type of the first phase adjuster and the transistor of the first conductivity type of the second phase adjuster adjacent thereto.

6. An interface circuit comprising:
a first phase adjuster including a plurality of parallel-connected first inverters configured to receive an input signal to be phase-adjusted, the first inverters being activated or deactivated depending on first control signals;
a delay circuit configured to delay the input signal to be phase-adjusted by a predetermined delay time;
a second phase adjuster including a plurality of parallel-connected second inverters configured to receive the delayed signal from the delay circuit, the second inverters being activated or deactivated depending on second control signals;
an output circuit configured to receive output signals of the first and second phase adjusters and output a signal whose phase is adjusted within a range of the delay time; and
a phase adjustment control unit configured to output the first control signals and the second control signals according to a control signal input,
wherein the second phase adjuster further includes:
a phase adjustment circuit which includes transistors that are connected to the plurality of second inverters and controlled by the input signal so as to block a current path between the first phase adjuster and the second phase adjuster during the delay time, and
a control signal generation circuit configured to generate the control signal and supply the control signal to the phase adjustment control unit.

* * * * *